United States Patent
Hashimoto

(10) Patent No.: US 11,289,627 B2
(45) Date of Patent: Mar. 29, 2022

(54) LIGHT EMITTING DEVICE AND METHOD OF MANUFACTURING SAME

(71) Applicant: NICHIA CORPORATION, Anan (JP)

(72) Inventor: Toru Hashimoto, Tokushima (JP)

(73) Assignee: Nichia Corporation, Anan (JP)

(*) Notice: Subject to any disclaimer, the term of this patent is extended or adjusted under 35 U.S.C. 154(b) by 27 days.

(21) Appl. No.: 16/230,072

(22) Filed: Dec. 21, 2018

(65) Prior Publication Data

US 2019/0198718 A1    Jun. 27, 2019

(30) Foreign Application Priority Data

Dec. 25, 2017 (JP) .............................. JP2017-248301
Jun. 28, 2018 (JP) .............................. JP2018-123620

(51) Int. Cl.
*H01L 33/00* (2010.01)
*H01L 33/48* (2010.01)
*H01L 33/50* (2010.01)
*H01L 33/60* (2010.01)
*H01L 33/58* (2010.01)

(52) U.S. Cl.
CPC .......... *H01L 33/483* (2013.01); *H01L 33/502* (2013.01); *H01L 33/58* (2013.01); *H01L 33/60* (2013.01); *H01L 2933/0041* (2013.01); *H01L 2933/0058* (2013.01)

(58) Field of Classification Search
CPC ..... H01L 33/483; H01L 33/502; H01L 33/58; H01L 33/60
See application file for complete search history.

(56) References Cited

U.S. PATENT DOCUMENTS

| | | | |
|---|---|---|---|
| 2010/0164082 A1 | 7/2010 | Fujisawa | |
| 2013/0140580 A1* | 6/2013 | Wirth | H01L 33/54 257/76 |
| 2014/0151734 A1 | 6/2014 | Ito et al. | |
| 2015/0001563 A1 | 1/2015 | Miki | |

(Continued)

FOREIGN PATENT DOCUMENTS

| | | |
|---|---|---|
| JP | 2010-153726 A | 7/2010 |
| JP | 2010-157638 A | 7/2010 |

(Continued)

*Primary Examiner* — Mounir S Amer
*Assistant Examiner* — Alexander Belousov
(74) *Attorney, Agent, or Firm* — Birch, Stewart, Kolasch & Birch, LLP

(57) ABSTRACT

A light emitting device includes a light emitting element having an upper emission face, a lower face and a lateral face(s); a reflecting member having an upper face, a lower face and inner and outer lateral faces, wherein the inner lateral face(s) is disposed on the lateral face side of the light emitting element; a wavelength conversion member having an upper emission face, a lower face and a lateral face(s), wherein the lower face is disposed on the upper emission face of the light emitting element and on the upper face of reflecting member; and a cover member having inner and outer lateral faces, wherein the inner lateral face(s) completely covers the lateral face(s) of the wavelength conversion member. The cover member contains a reflecting substance and a coloring substance, and the body color of the wavelength conversion member and body color of the cover member are the same or similar in color.

12 Claims, 21 Drawing Sheets

(56) References Cited

U.S. PATENT DOCUMENTS

| | | |
|---|---|---|
| 2015/0021642 A1 | 1/2015 | Nakabayashi |
| 2015/0102368 A1* | 4/2015 | Wirth ................. H01L 33/50 257/89 |
| 2015/0340574 A1 | 11/2015 | Tamaki |
| 2016/0276557 A1* | 9/2016 | Wada .................. H01L 33/22 |
| 2017/0077071 A1* | 3/2017 | Wirth ................. H01L 27/15 |
| 2017/0154880 A1 | 6/2017 | Ozeki et al. |
| 2018/0113361 A1* | 4/2018 | Lee ................ G02F 1/133602 |
| 2018/0182917 A1* | 6/2018 | Kuramoto ............ H01L 24/96 |
| 2019/0057954 A1* | 2/2019 | Blakely ............ H01L 27/0248 |

FOREIGN PATENT DOCUMENTS

| | | |
|---|---|---|
| JP | 2013-012545 A | 1/2013 |
| JP | 2015-012081 A | 1/2015 |
| JP | 2015-038963 A | 2/2015 |
| JP | 2015-220446 A | 12/2015 |
| JP | 2016-178236 A | 10/2016 |
| JP | 2017-108092 A | 6/2017 |
| WO | WO 2013/011628 A1 | 1/2013 |

\* cited by examiner

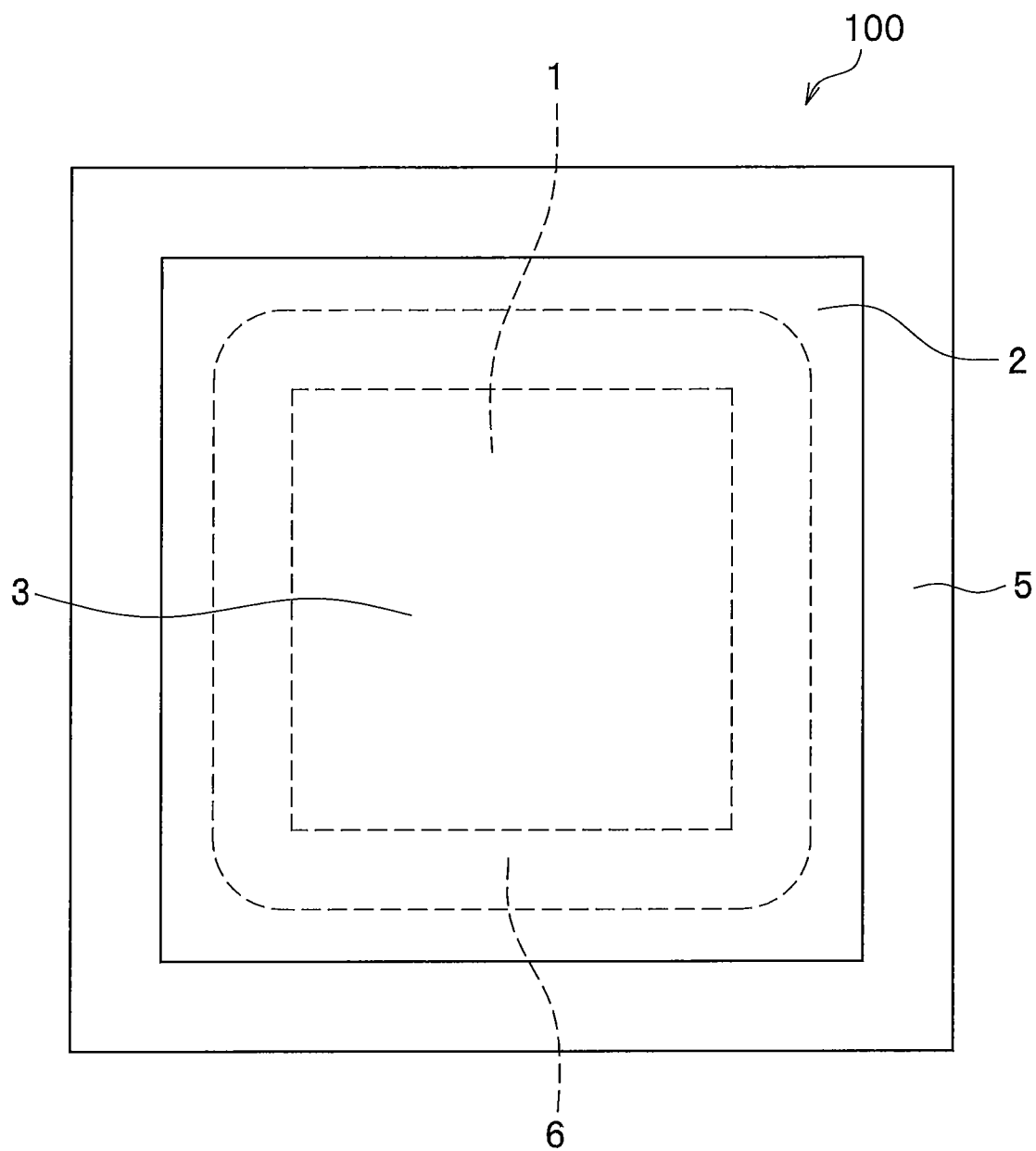

LIGHT EMITTING DEVICE AND METHOD OF MANUFACTURING SAME

CROSS-REFERENCE TO RELATED APPLICATION

This application claims priority to Japanese Patent Application No. 2017-248301 filed on Dec. 25, 2017, and Japanese Patent Application No. 2018-123620 filed on Jun. 28, 2018, the disclosures of which are thereby incorporated by reference in their entirety.

BACKGROUND

The present disclosure relates to a light emitting device and a method of manufacturing the same.

Japanese Unexamined Patent Application Publication No. 2013-12545, for example, describes a light emitting device in which a phosphor sheet is bonded on a light emitting element and the periphery of the phosphor sheet and the light emitting element are covered by a light reflecting white member. The upper face of such a light emitting device is made up of two colors: the color of the phosphor contained in the phosphor sheet (e.g., yellow) and the color of the white member (i.e., white).

SUMMARY

In the case of using a conventional light emitting device as the light source of a lighting device such as a flashlight of a camera in a smartphone, for example, the body color of the phosphor and the color of the white member appear on the lens when not emitting light. For this reason, in the case of a conventional light emitting device, depending on the design of the smartphone or its cover, for example, the external appearance might not be desirable because the entire upper face of the light emitting device does not have the same or similar body color of the wavelength conversion member when not emitting light.

Accordingly, certain embodiments of the present disclosure can provide a light emitting device having high contrast between the emission region and the non-emission region when emitting light, while the entire upper face of the light emitting device being the same or a similar to the color of the wavelength conversion member when not emitting light, and a method of manufacturing the light emitting device.

The light emitting device related to certain embodiment of the present disclosure includes: a light emitting element having an upper emission face, a lower face and one or more lateral faces; a reflecting member having an upper face, a lower face and one or more inner and outer lateral faces, wherein the inner lateral face or faces is disposed on the lateral face side of the light emitting element; a wavelength conversion member having an upper emission face, a lower face and one or more lateral faces, wherein the lower face is disposed on the upper emission face of the light emitting element and on the upper face of reflecting member; and a cover member having one or more inner and outer lateral faces, wherein the inner lateral face or faces completely covers the lateral face or faces of the wavelength conversion member. The cover member contains a reflecting substance and a coloring substance. A body color of the wavelength conversion member and a body color of the cover member are the same or similar in color.

The method of manufacturing a light emitting device related to certain embodiment of the present invention includes: disposing an upper emission face of a light emitting element, which also has a lower face and one or more lateral faces, on a lower face of a wavelength conversion member, which also has an upper emission face and one or more lateral faces; supplying a reflecting member to cover the light emitting element; removing a portion of the wavelength conversion member in an area surrounding the light emitting element to expose the lateral face or faces of the wavelength conversion member; and supplying a cover member to cover the outer lateral face or faces of the wavelength conversion member, the covering member containing a reflecting substance and a coloring substance and having a body color the same as or similar to a body color of the wavelength conversion member.

The light emitting device related to the embodiment of the present disclosure can increase the contrast between the emission region and the non-emission region when emitting light, and make the entire upper face of the light emitting device the same or similar color of the wavelength conversion member when not emitting light. The method of manufacturing a light emitting device related to the embodiment of the present disclosure can produce a light emitting device that can increase the contrast between the emission region and the non-emission region when emitting light, and make the entire upper face of the light emitting device the same or similar color of the wavelength conversion member when not emitting light.

BRIEF DESCRIPTION OF THE DRAWINGS

FIG. 1C is a top view schematically showing the structure of the light emitting device related to certain embodiment.

DESCRIPTION

Embodiments

Figure 1A:
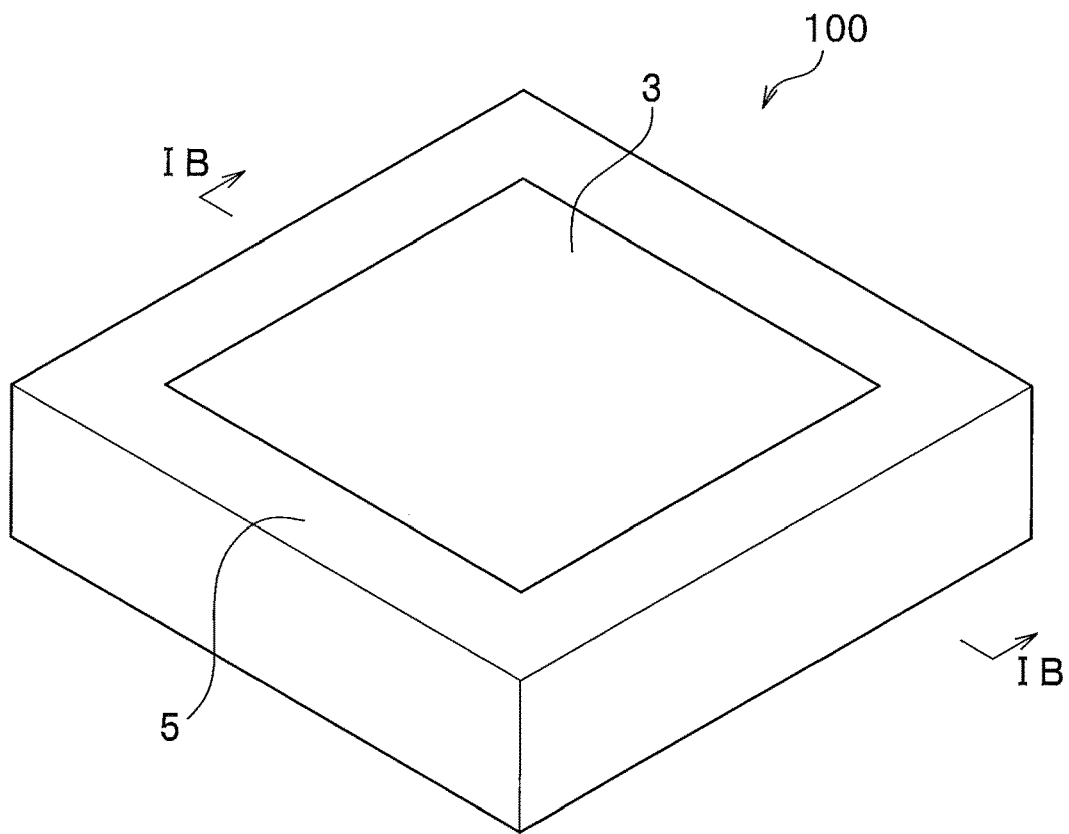
FIG. 1A is a perspective view schematically showing a structure of a light emitting device related to certain embodiment.

Certain embodiments will be explained below with reference to the accompanying drawings. The embodiments described below, however, exemplify light emitting devices and methods for manufacturing light emitting devices for the purpose of embodying the technical concepts of the invention, and are not intended to limit the invention. The dimensions, materials, and shapes of the constituent elements, as well as the relative positioning thereof described in connection with the embodiments are offered merely as examples, and are not intended to limit the scope of the invention to those described unless otherwise specifically noted. The sizes of the components, their positional relationship, and the like, shown in the drawings might be exaggerated for clarity of explanations.

Light Emitting Device

First, a light emitting device related to one embodiment will be explained.

As shown in FIG. 1A to FIG. 1D, a light emitting device 100 includes a light emitting element 1, a reflecting member 2, a wavelength conversion member 3, and a cover member 5. The light emitting device 100 further includes a light guide member 6 disposed on the lateral faces of the light emitting element 1.

The upper face of the light emitting device 100 is made up of an emission region and a non-emission region. An emission region refers to the region of the upper face of the light emitting device 100 that emits light (e.g., the wavelength conversion member 3) when it is caused to emit light, and a non-emission region is the region excluding the emission region (e.g., the cover member 5).

Light Emitting Element

For the light emitting element 1, a semiconductor light emitting element such as an LED can be used. The light emitting element 1 can be one having a pair of positive and negative electrodes 11 and 12 formed on an element structure composed of various semiconductors. For the light emitting element 1, one structured with a nitride semiconductor ($In_xAl_yGa_{1-x-y}N$, $0 \leq x$, $0 \leq y$, $x+y \leq 1$) capable of efficiently exciting a phosphor is particularly preferable. In addition, the light emitting element 1 may be formed of a zinc sulfide-based semiconductor, zinc selenide-based semiconductor, or silicon carbide-based semiconductor.

Reflecting Member

The reflecting member 2 reflects light from the light emitting element 1, and make the light to exit via the wavelength conversion member 3. The reflecting member 2 is a member for reflecting the light emitted by the light emitting element 1 and travelling laterally or downwards towards the wavelength conversion member 3 which is the emission region of the light emitting device 100.

The reflecting member 2 is disposed on the lateral face sides of the light emitting element 1 and under the wavelength conversion member 3. Specifically, the reflecting member 2 covers the lower face (i.e., the side on which the electrodes 11 and 12 are formed) of the light emitting element 1. Furthermore, the reflecting member 2 may surround and cover via a light guide member 6 regions of the lateral faces of the light emitting element 1 that are covered by the light guide member 6, while directly cover regions of the lateral faces of the light emitting element where the light guide member 6 exists.

The reflecting member 2 in the present embodiment is disposed via the light guide member 6 formed on the lateral faces of the light emitting element 1, but may be disposed directly on the lateral faces of the light emitting element 1 without disposing a light guide member 6.

The reflecting member 2, for example, is a resin layer that contains at least one reflecting substance. The reflecting member 2 may be structured by a base material or binder containing at least one filler in addition to at least one reflecting substance.

A binder in the reflecting member 2 is a resin for binding the reflecting substance and the filler described earlier to the lateral face sides and the lower face (i.e., the side on which the electrode 11 and 23 are formed) of the light emitting element 1. Examples of resins used as a binder include polycarbonate, epoxy, phenol, silicone, acrylic, TPX, polynorbornene, and urethane resins. Other examples of resins serving as a binder include modified resins of these, and hybrid resins containing one or more of these resins. Among such resins, silicone resins or their modified resins are preferable because they are highly heat resistant and highly light resistant, and have less volumetric shrinkage after being cured.

A reflecting substance is a substance that reflects the light emitted by the light emitting element 1. Examples of reflecting substances include silica, titanium oxide, silicon oxide, aluminum oxide, potassium titanate, zinc oxide, boron nitride, and the like. Resin powder such as silicone powder may alternatively be used.

A filler may be added for the purpose of increasing the strength of the reflecting member 2 which is a resin layer, or increasing the thermal conductivity of the reflecting member 2. Examples of fillers include glass fibers, whiskers, aluminum oxide, silicon oxide, boron nitride, zinc oxide, aluminum nitride, and the like.

Light Guide Member

The light guide member 6 is a member for facilitating light extraction from the light emitting element 1 by guiding the light from the light emitting element 1 to the wavelength conversion member 3. The light guide member 6 can increase luminous flux and light extraction efficiency.

The light guide member 6 is formed by allowing the bonding member 6 for bonding the wavelength conversion member 3 and the light emitting element 1 to creep up the lateral faces of the light emitting element 1. During the manufacturing step, the structure is oriented upside down.

For the light guide member 6, a light transmissive resin material can be used, for example. Examples of materials for the light guide member 6 include light transmissive adhesive materials such as the resins employed as the base material or binder for the reflecting member 2 described earlier. Moreover, it may contain a diffusing agent such as silica, titanium oxide, silicon oxide, aluminum oxide, potassium titanate, zinc oxide, boron nitride and the like. This can allow the light to enter the wavelength conversion member 3 more evenly thereby attenuating color non-uniformity of the light emitting device 100.

Figure 1B:
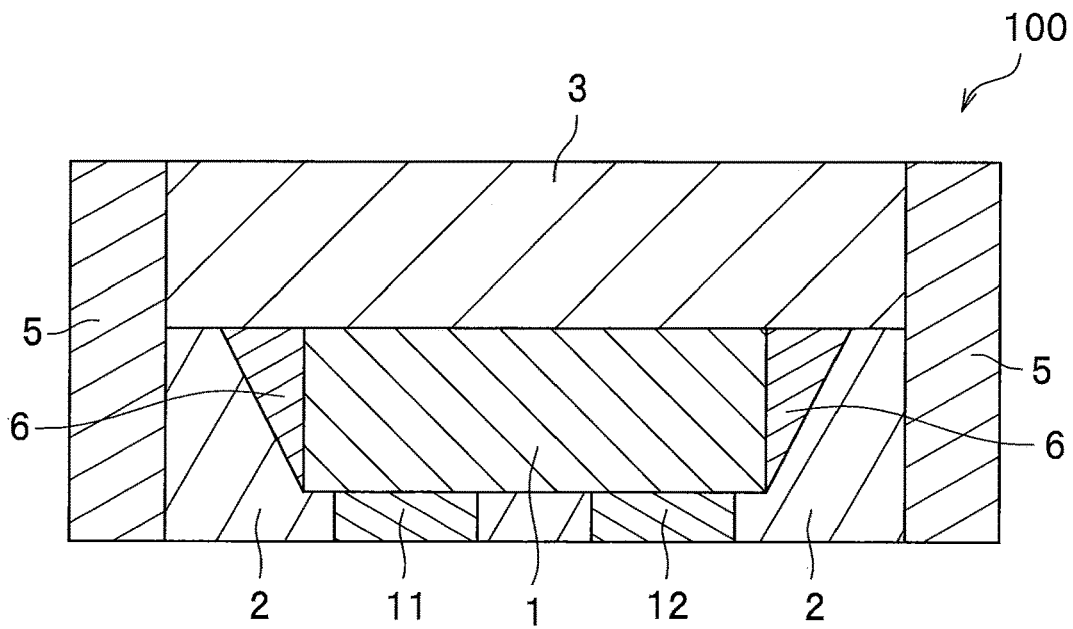
FIG. 1B is a cross-sectional view taken along line IB-IB in FIG. 1A.
Figure 1D:
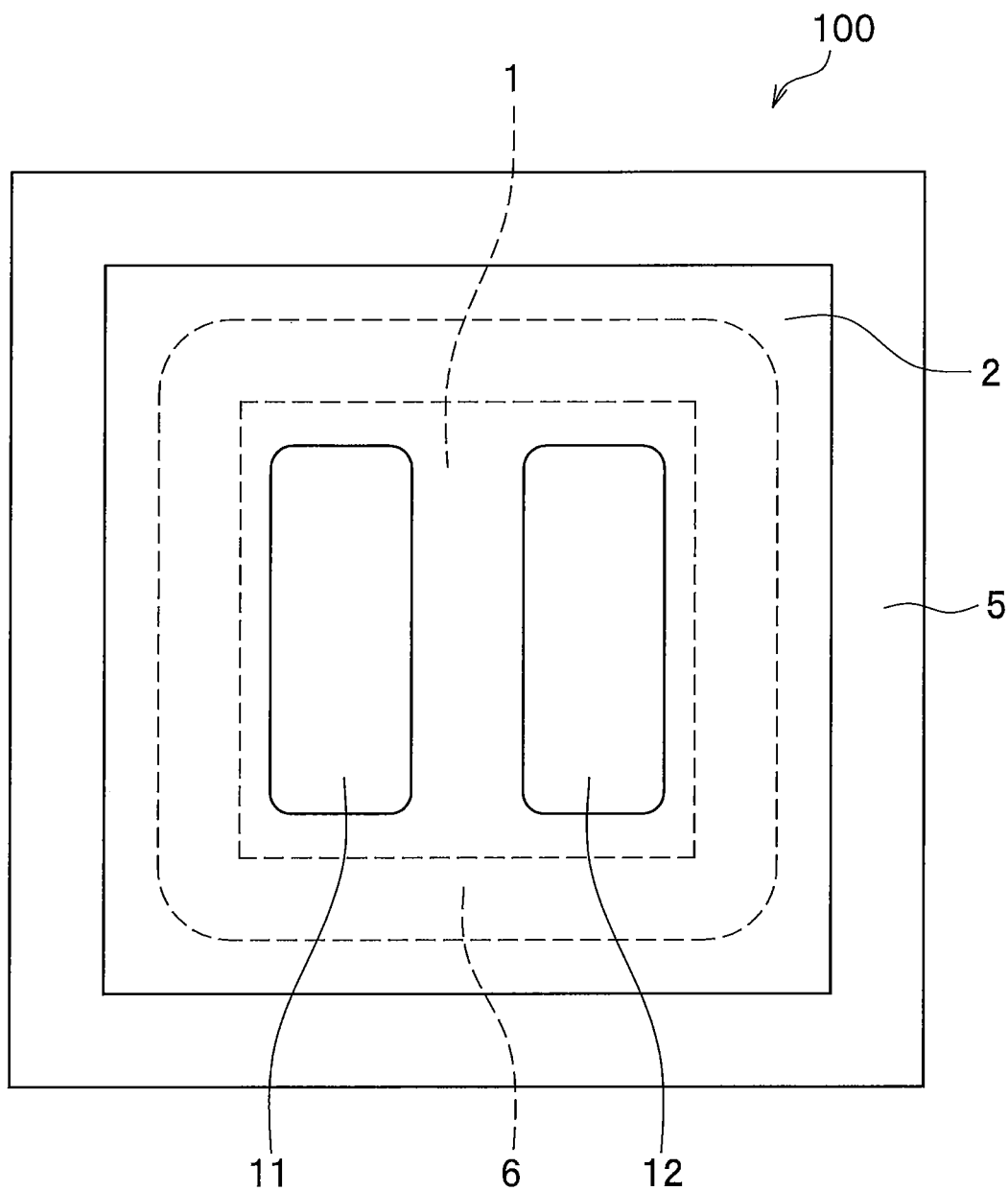
FIG. 1D is a bottom view schematically showing the structure of the light emitting device related to certain embodiment.

The light guide member 6, as shown in FIG. 1B, is formed into a triangular shape in a cross-sectional view so that the width of the light guide member 6 spreads from the lower face (i.e., the side on which the electrodes 11 and 12 are formed) of the light emitting element 1 towards the wavelength conversion member 3. Such a shape can further increase luminous flux and light extraction efficiency. However, the shape of the light guide member 6 is not restricted in particular. For example, the shape of the light guide member 6 may be projected towards the reflecting member 2, or recessed towards the light emitting element 1.

The light guide member 6 may cover portions of the lateral faces of the light emitting element 1, but preferably covers substantially the entire lateral faces of the light emitting element 1 from the perspective of increasing luminous flux and light extraction efficiency.

The light guide member 6, moreover, may be disposed between the wavelength conversion member 3 and the light emitting element 1.

Wavelength Conversion Member

The wavelength conversion member 3 contains at least one wavelength conversion substance. The wavelength conversion substance absorbs a portion of the light emitted by the light emitting element 1, and converts into and emits light having a different wavelength. The wavelength conversion substance used in the wavelength conversion member 3 is, for example, a phosphor. The explanation below assumes that the wavelength conversion member is a phosphor.

The wavelength conversion member 3 is disposed on the emission face of the light emitting element 1 and on the reflecting member 2.

The lower face of the wavelength conversion member 3, in other words, a surface facing the emission face of the light emitting element 1, is larger than the emission face which is the upper face of the light emitting element 1.

The base material or binder for the wavelength conversion member 3 is preferably formed of a material comprising a light transmissive resin. Examples of the resin in the present embodiment include those resins used as the base material or binder for the reflecting member 2 described earlier. Among such resins, silicone resins or their modified resins are preferable because they are highly heat resistant and highly light resistant as well as having less volumetric shrinkage after being cured. The base material or binder for the wavelength conversion member 3, moreover, may be formed of a material comprising glass besides a resin.

Examples of phosphors to be contained in the wavelength conversion member 3 include cerium-activated yttrium aluminum garnet, cerium-activated lutetium aluminum garnet, cerium-activated terbium aluminum garnet, nitride-containing aluminocalcium silicate activated by one or both of europium and chromium, europium-activated SiAlON, europium-activated silicate, manganese-activated potassium fluorosilicate, and the like.

In the present embodiment, as described later, as long as the body color of the wavelength conversion member 3 and the body color of the cover member 5 are the same or similar in colors, the body color of the phosphor itself can be any color. A body color refers to the color of a member itself when the light emitting device 100 is not emitting light.

For example, in the case of using a phosphor having the body color of which is white, the body color of the wavelength conversion member 3 becomes white. For this reason, as described later, if the body color of the wavelength conversion member 3 and the body color of the cover member 5 were the same or similar in colors, the entire upper face of the light emitting device 100 would be white color.

In the case of using the light emitting device 100 as a white light source for a lighting device such as a flashlight of a camera, for example, a light emitting element having a blue emission color and a phosphor having a yellow emission color and a yellow body color are preferably used. It is also preferable to use a light emitting element having a blue emission color and a phosphor having an orange emission color and an orange body color.

Examples of phosphors having a yellow body color and a yellow emission color include yttrium aluminum garnet-based phosphors (i.e., YAG-based phosphors), lutetium aluminum garnet-based phosphors (i.e., LAG-based phosphors), terbium aluminum garnet-based phosphors (i.e., TAG-based phosphors), and the like. Examples of phosphors having a yellow body color and a red emission color include KSF. The body color of these phosphors is 10Y or 5Y in the Munsell hue circle of the Munsell color system (i.e., 20 hues).

Examples of phosphors having an orange body color and a red emission color include SCASN, CASN, and the like. The body color of these phosphors is 10YR or 5YR in the Munsell hue ring of the Munsell color system (i.e., 20 hues).

Moreover, a combination of a phosphor having a yellow emission color and a phosphor having a red emission color can make the emission color orange.

Furthermore, examples of phosphors whose body color is yellow or orange include hues 5YR, 10YR, 5Y, and 10Y in the Munsell hue circle of the Munsell color system (i.e., 20 hues).

In the case of a phosphor, having a yellow body color is, for example, 10Y or 5Y. In the case of an orange phosphor, it is, for example, 10YR or 5YR. The phosphor having a yellow body color will be explained below using 5Y in the Munsell hue circle of the Munsell color system (i.e., 20 hues) as an example.

In the Munsell color system, the lightness, for example, is 7 to 9.

In the Munsell color system, the chroma, for example, is 4 to 14.

As described later, in the case where the cover member 5 contains a wavelength conversion substance, the wavelength conversion member 3 preferably contains a wavelength conversion substance having the same or similar composition as that of the wavelength conversion substance contained in the cover member 5. This makes it easier for the entire upper face of the light emitting device 100 to be of the same or similar color as that of the wavelength conversion member 3 when not emitting light.

The wavelength conversion member 3 may contain a diffusing agent. The diffusing agent is added to efficiently diffuse the light emitted from the light emitting element 1 and the phosphor. Examples of diffusing agents are similar to those listed earlier as reflecting substances to be contained in the reflecting member 2.

The thickness of the wavelength conversion member 3 in the up and down direction can be set according to the phosphor content, the color tone obtained after combining the light emitted by the light emitting element 1 and the light emitted by the phosphor, and the like, and can be set, for example, to 50 μm to 300 μm.

Cover Member

The cover member 5 is a member that covers the outer lateral faces of the wavelength conversion member 3 and the outer lateral faces of the reflecting member 2. In the present embodiment, the cover member 5 covers from the upper edges to the lower edges of the outer lateral faces of the wavelength conversion member 3 as well as from the upper edges to the lower edges of the outer lateral faces of the reflecting member 2. The cover member 5 forms portions of the lateral faces of the light emitting device 100.

The cover member 5, for example, is a resin layer. Examples of resins used as the base material or binder for the cover member 5 include those resins described earlier which can be used as the base material or binder for the reflecting member 2. Among such resins, epoxy resins or their modified resins have good adhesive and gas barrier properties, and thus are preferable. Furthermore, silicone resins and their modified resins are highly heat resistant and highly light resistant, as well as having limited post-curing volumetric shrinkage, and thus are preferable.

The cover member 5 contains a reflecting substance and a coloring substance.

Examples of reflecting substances include those that can be used in the reflecting member 2.

The amount of the reflecting substance contained in the cover member 5 is preferably in the range of from 30 percentage by mass to 70 percentage by mass relative to the total mass of the cover member 5. A reflecting substance content in the reflecting member 5 of at least 30 percentage by mass can further increase the contrast between the emission region and the non-emission region when emitting light. On the other hand, a reflecting substance content in the reflecting member 5 of 70 percentage by mass at most can improve economic performance.

For the coloring substance, at least one of wavelength conversion substances, pigments, and dyes is included.

Examples of wavelength conversion substances include the same or similar to the wavelength conversion substances to be contained in the wavelength conversion member 3.

No particular restrictions apply to pigments. Examples include those employing inorganic or organic materials such as those listed below.

Examples of inorganic materials include red iron oxide ($Fe_2O_3$), red lead ($Pb_3O_4$), antimony nickel titanium-based oxide, barium nickel titanium-based oxide, antimony chromium titanium-based oxide, niobium chromium titanium-based oxide, and the like.

Examples of organic materials include anthraquinone-, azo-, quinacridone-, perylene-, diketopyrrolopyrrole-, monoazo-, disazo-, pyrazolone-, benzimidazolone-, quinoxaline-, azomethine-, isoindolinone-, isoindoline-based materials, and the like.

No particular restrictions apply to dyes, and examples include anthraquinone-based dyes, methine-based dyes, azomethine-based dyes, oxazine-based dyes, azo-based dyes, styryl-based dyes, coumarin-based dyes, porphyrin-based dyes, dibenzo-furanone-based dyes, diketopyrrolopyrrole-based dyes, rhodamine-based dyes, xanthene-based dyes, pyrromethene-based dyes, and the like.

Pigments and dyes basically are preferably those that do not convert the light from the light emitting element 1 into light of a different wavelength.

The body color of the wavelength conversion member 3 and the body color of the cover member 5 are of the same or similar colors. "The same or similar colors" here in terms of the Munsell color system (20 hues) means having:

hue in the range of three in the hue circle;

lightness in the range of three; and chroma in the range of three. In other words, "the same or similar colors" include neighboring colors on adjacent sides in terms of hue, lightness, and chroma in the Munsell color system (20 hues).

Figure 2:
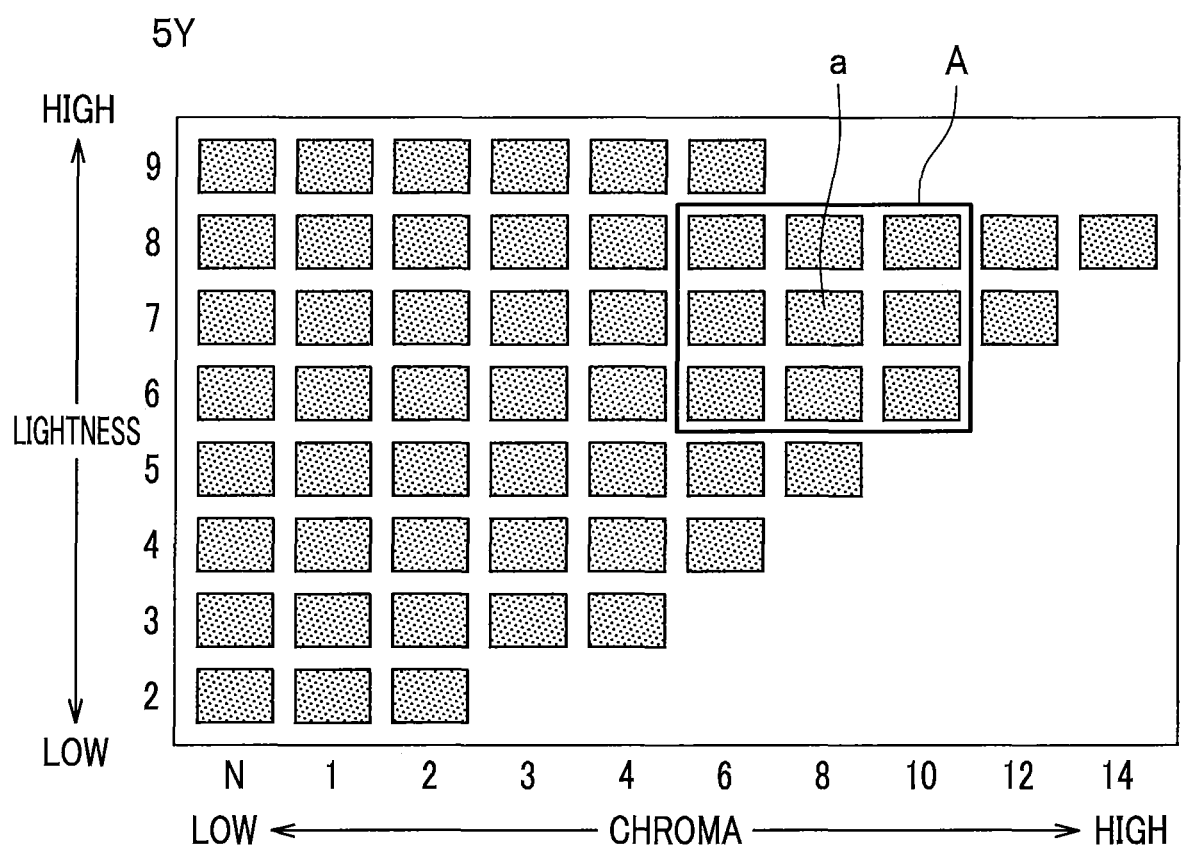
FIG. 2 is a chart schematically showing constant hue plates of a hue (5Y) in the Munsell color system.

Specifically, for example, assuming that a certain color having a Y (yellow) hue as color a of the constant hue plates (5Y) in the Munsell color system shown in FIG. 2, those in a range A are defined as the same or similar colors.

The body color can be measured by using a measuring instrument, such as a CM series spectrophotometer (manufactured by Konica Minolta), CR series color difference meter (manufactured by Konica Minolta), or the like. Such measuring instruments having a xenon lamp light source and a light receiving element of a silicon photodiode capable of performing spectral dispersion using plane diffraction grating and outputting in the form of the Munsell color system can simply be used.

Making the body color of the wavelength conversion member 3 and the body color of the cover member 5 the same or similar colors can make the entire upper face of the light emitting device 100 the color of the wavelength conversion member 3 when not emitting light.

"The entire upper face of the light emitting device 100 when not emitting light being the color of the wavelength conversion member 3" includes the color of the entire upper face of the light emitting device 100 being the same, or substantially the same, as the color of the wavelength conversion member 3. "Substantially the same" can include neighboring colors on adjacent sides of the constant hue plate in terms of hue, lightness, and chroma in the Munsell color system (20 hues) described above.

The length of the cover member 5 widthwise in a top view is preferably in the range of from 20 μm to 200 μm. A length of the cover member 5 in the width direction in a top view of at least 20 μm can more easily make the color of the entire upper face of the light emitting device 100 the same as or substantially the same as the color of the wavelength conversion member 3 when not emitting light. A length of the cover member 5 in the width direction in a top view of 200 μm at most can facilitate reduction in the size a of the light emitting device 100.

Operation of Light Emitting Device

The operation of the light emitting device 100 will be explained next.

When the light emitting device 100 is driven, the light emitting element 1 emits light as power is supplied to the light emitting element 1 from an external power supply via the electrodes 11 and 12. A portion of the light emitted by the light emitting element 1 is reflected by the reflecting member 2, which passes through the wavelength conversion member 3 to be extracted. At this point, allowing the cover member 5 to contain a reflecting substance can increase the contrast (i.e., difference in luminance) between the emission region and the non-emission region at the upper face of the light emitting device 100.

Method of Manufacturing the Light Emitting Device

Next, one example of the method of manufacturing the light emitting device 100 related to the embodiment will be explained with reference to FIG. 3 to FIG. 7C. In FIG. 4A to FIG. 7C, a single light emitting device 100 among multiple light emitting devices 100 simultaneously manufactured is schematically illustrated.

Figure 3:
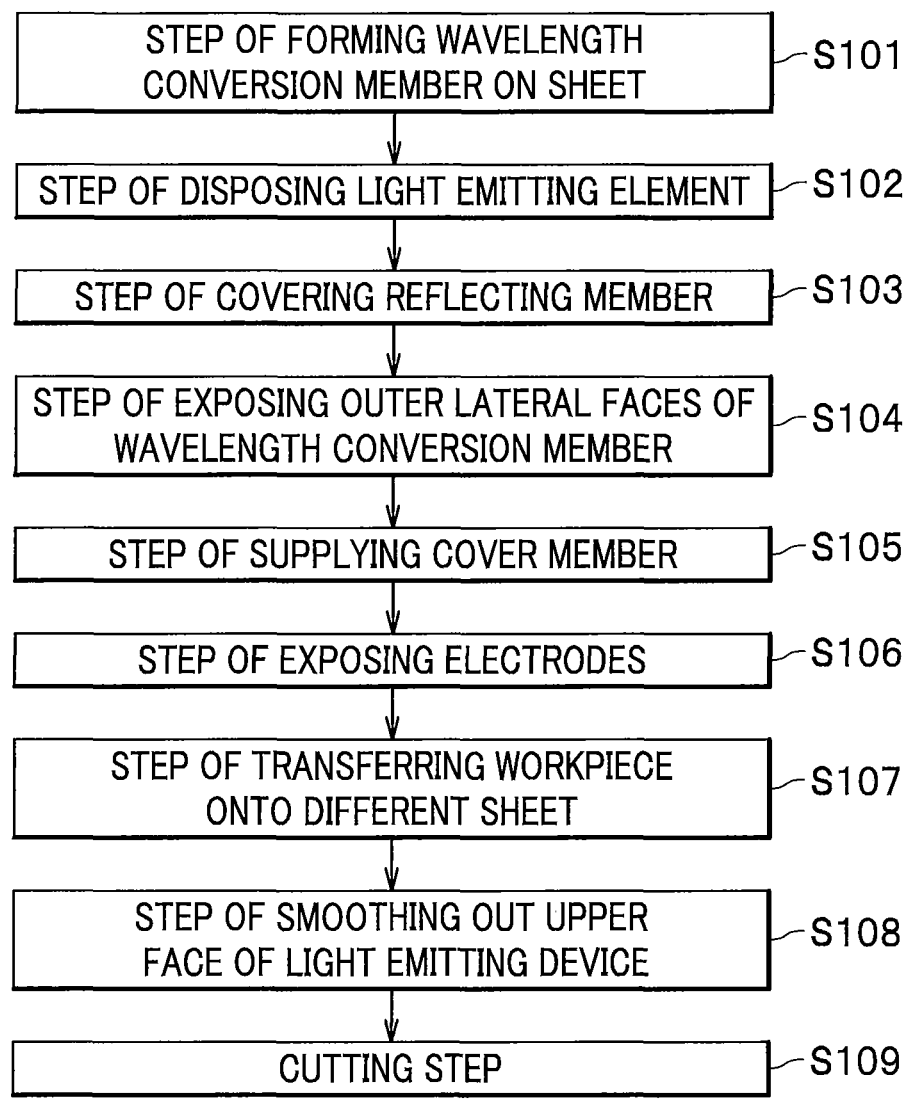
FIG. 3 is a flowchart for the method of manufacturing a light emitting device related to certain embodiment.

As shown in FIG. 3, the method of manufacturing the light emitting device 100 related to the embodiment includes: step S101 of forming a wavelength conversion member on a sheet; step S102 of disposing a light emitting element; step S103 of covering a reflecting member; step S104 of exposing outer lateral faces of the wavelength conversion member; step S105 of supplying a cover member; step S106 of exposing electrodes; step S107 of transferring the workpiece onto different sheet; step S108 of smoothing out an upper face of the light emitting device; and a cutting step S109, which are performed in that order.

The materials and layout of the members are as described with reference to the light emitting device 100 above, and thus the explanations here will be omitted when appropriate.

Step of Forming Wavelength Conversion Member on Sheet

Figure 4A:
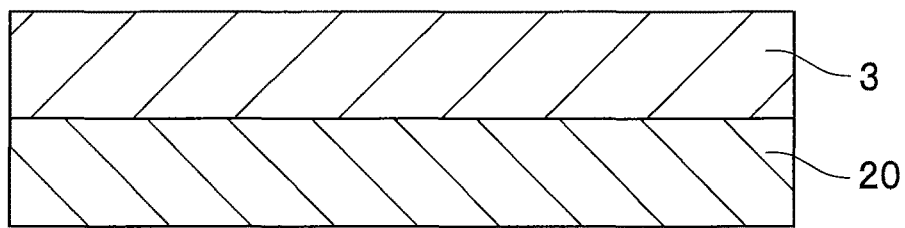
FIG. 4A is a cross-sectional view showing a step of forming a wavelength conversion member on a sheet in the method of manufacturing a light emitting device related to the embodiment.

The step S101 of forming a wavelength conversion member on a sheet, as shown in FIG. 4A, is a step of forming a wavelength conversion member 3 on a sheet 20 of a resin or the like.

The formation of the wavelength conversion member 3 on the sheet 20 can be performed, for example, by printing, compression molding, phosphor electrodeposition, or stacking a sheet-shaped wavelength conversion member.

Step of Disposing Light Emitting Element

Figure 4B:
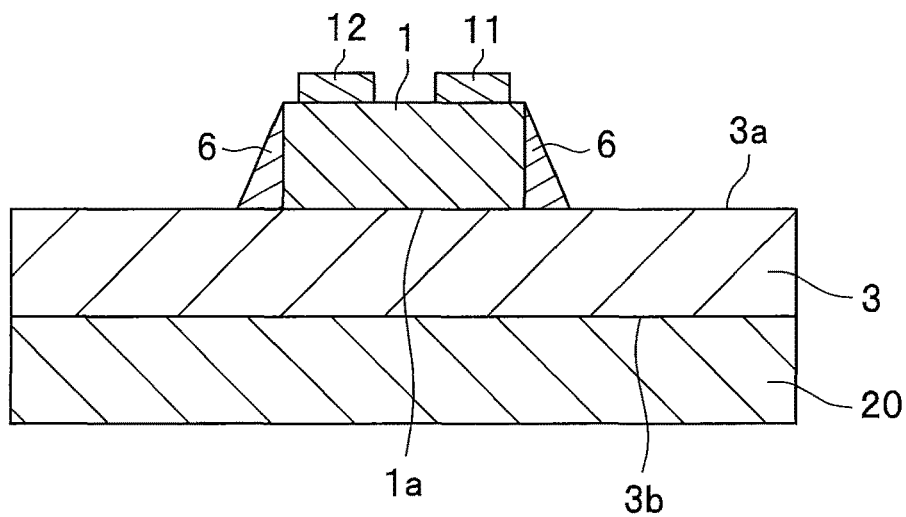
FIG. 4B is a cross-sectional view showing a step of disposing a light emitting element in the method of manufacturing a light emitting device related to the embodiment.

The step S102 of disposing a light emitting element, as shown in FIG. 4B, is a step of disposing a light emitting element 1 so that the emission face 1a faces the first face 3a of the wavelength conversion member 3 which has a first face 3a and a second face 3b which opposes the first face 3a.

In the step S102, the face of the light emitting element 1 opposite the face on which the electrodes 11 and 12 are disposed, in other words, the emission face 1a, is bonded to the first face 3a of the wavelength conversion member 3 via a bonding member. At this time, from the perspective of luminous intensity distribution, the two are preferably bonded so that the center of the first face 3a of the wavelength conversion 3 coincides with the center of the emission face 1a of the light emitting element 1 when viewed from the top.

Here, the bonding member can be formed on the lateral faces of the light emitting element 1 by adjusting the amount of the bonding member to allow the bonding member to creep up the lateral faces of the light emitting element 1. In this manner, the light emitting device 100 will have a structure in which a light guide member 6 serving as a bonding member is disposed on the lateral faces of the light emitting element 1.

Alternatively, the light guide member 6 which is the bonding member may be disposed between the emission face 1*a* of the light emitting element 1 and the first face 3*a* of the wavelength conversion member 3 to a predetermined thickness in the up/down direction. This can more firmly bond the light emitting element 1 and the wavelength conversion member 3 together. Although not shown in the drawings, the bonding member having very small thickness is interposed between the emission face 1*a* of the light emitting element 1 and the first face 3*a* of the wavelength conversion member 3 to bond the light emitting element 1 and the wavelength conversion member 3 together.

Step of Supplying Reflecting Member

Figure 4C:
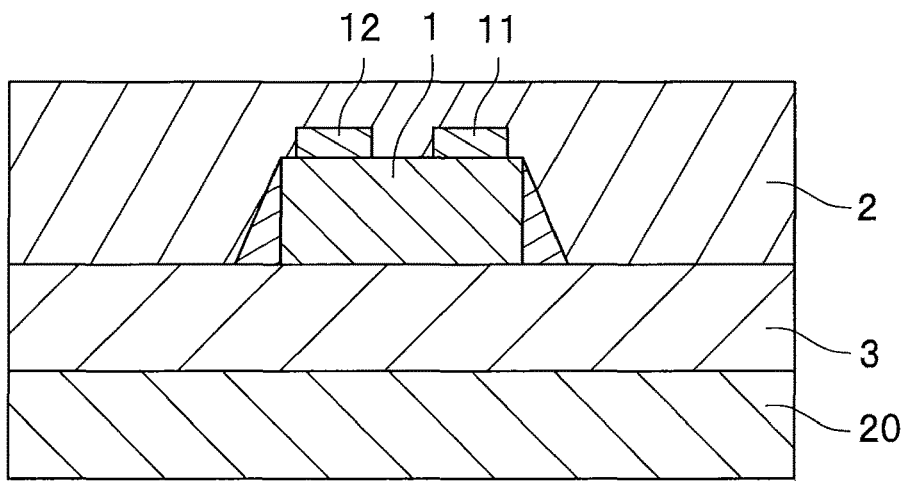
FIG. 4C is a cross-sectional view showing a step of supplying a reflecting member to cover the light emitting element, etc. in the method of manufacturing a light emitting device related to the embodiment.

The step S103 of supplying a reflecting member, as shown in FIG. 4C, is a step of covering the light emitting element 1 disposed on the wavelength conversion member 3 with a reflecting member 2.

In the step S103, the entire light emitting element 1, including the electrodes 11 and 12, is covered with the reflecting member 2. In the step S103, the reflecting member 2 is disposed from the surface of the wavelength conversion member 3 to the upper faces of the electrodes 11 and 12.

The light emitting element 1 can be covered, for example, by using a dispenser which is positioned above the fixed sheet 20 and movable in the up/down or lateral direction relative to the sheet 20. The reflecting member 2 is formed by supplying resin to-be the reflecting member 2 on the wavelength conversion member 3 by using a dispenser.

This can alternatively be accomplished by compression molding, transfer molding, or the like.

Step of Exposing Outer Lateral Faces of Wavelength Conversion Member

Figure 5A:
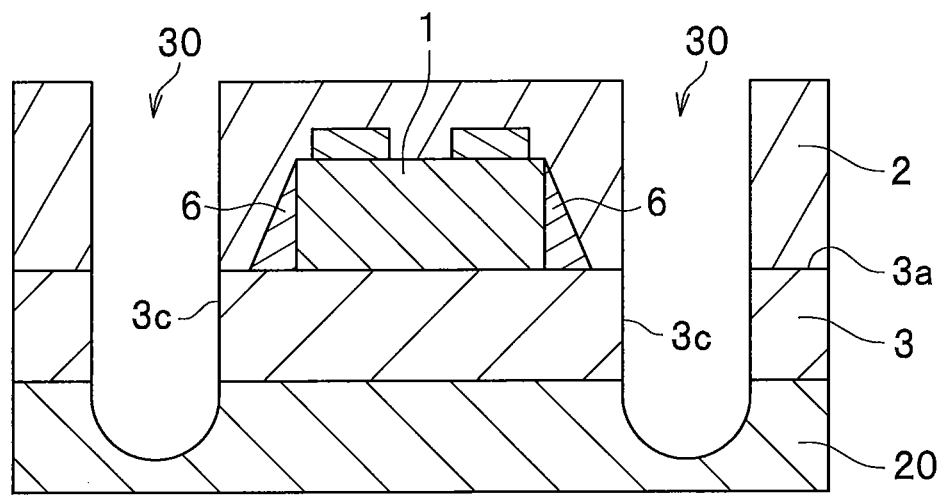
FIG. 5A is a cross-sectional view showing a step of exposing outer lateral faces of the wavelength conversion member in the method of manufacturing a light emitting device related to the embodiment.
Figure 5B:
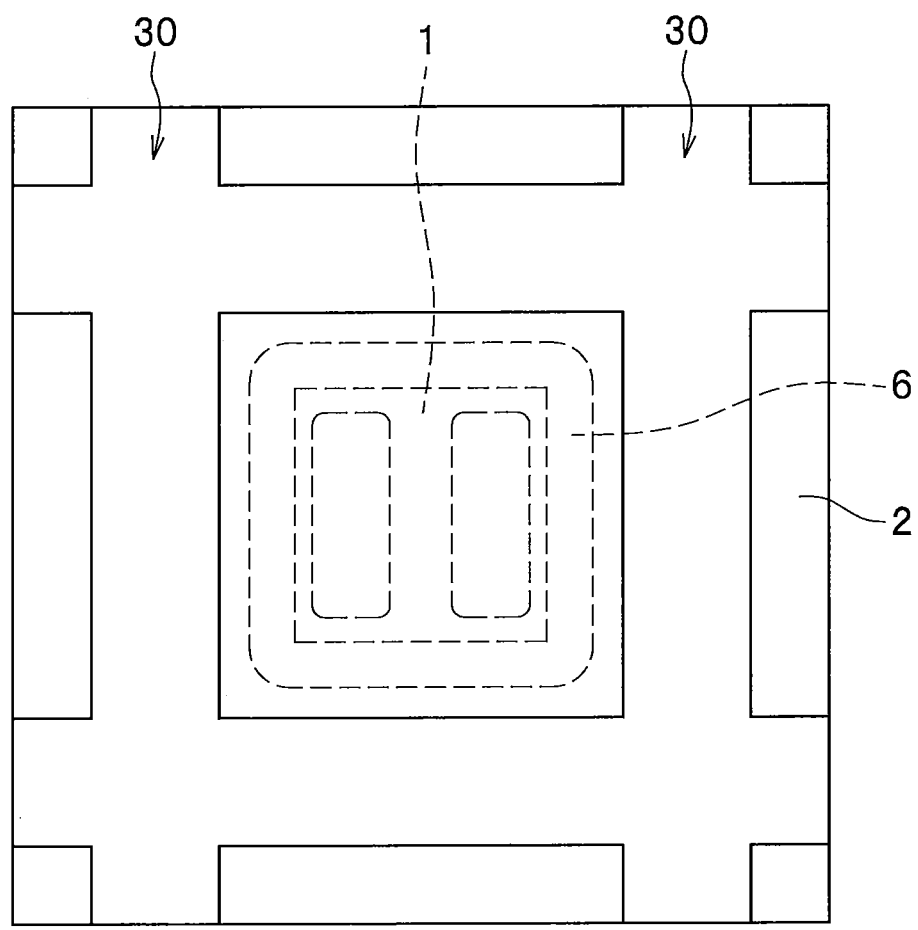
FIG. 5B is a top view showing a step of exposing the outer lateral faces of the wavelength conversion member in the method of manufacturing a light emitting device related to the embodiment.

The step S104 of exposing the outer lateral faces of the wavelength conversion member, as shown in FIG. 5A and FIG. 5B, is a step of removing a portion of the wavelength conversion member 3 in the area surrounding the light emitting element 1, thereby exposing the outer lateral faces 3*c* of the wavelength conversion member 3. The partial removal of the wavelength conversion member 3 here is performed from the reflecting member 2 side which is the first face 3*a* side of the wavelength conversion member 3.

In the step S104, recessed portions 30 are formed, which penetrates through the reflecting member 2 and the wavelength conversion member 3, and into the sheet 20. In the step S104, the recessed portions 30 are formed in the locations where cover members 5 is to be formed before dividing the workpiece into individual light emitting elements 1. The formation of the recessed portions 30 exposes the outer lateral faces 3*c* of the wavelength conversion member 3.

For example, the recessed portions 30 can be created by removing the members from the upper face of the reflecting member 2 towards the sheet 20 in a perpendicular direction or inclined at ceratin degrees with the perpendicular direction by using a blade having a predetermined width. Specifically, the recessed portions 30 can be formed by partly removing the sheet 20 through both the reflecting member 2 and the wavelength conversion member 3.

The formation of the recessed portions 30 may be accomplished by using a laser beam or by etching.

The recessed portions 30 may be formed at any position as long as they are in the area surrounding the light emitting element 1. In the case where a light guide member 6 is provided on the lateral faces of the light emitting element 1, the recessed portions 30 may be formed so as to partially remove the light guide member 6. In order to increase emission efficiency, the recessed portions 30 are preferably formed on the outside of the light guide member 6 as shown in FIG. 5A and FIG. 5B.

Step of Supplying Cover Member

Figure 6A:
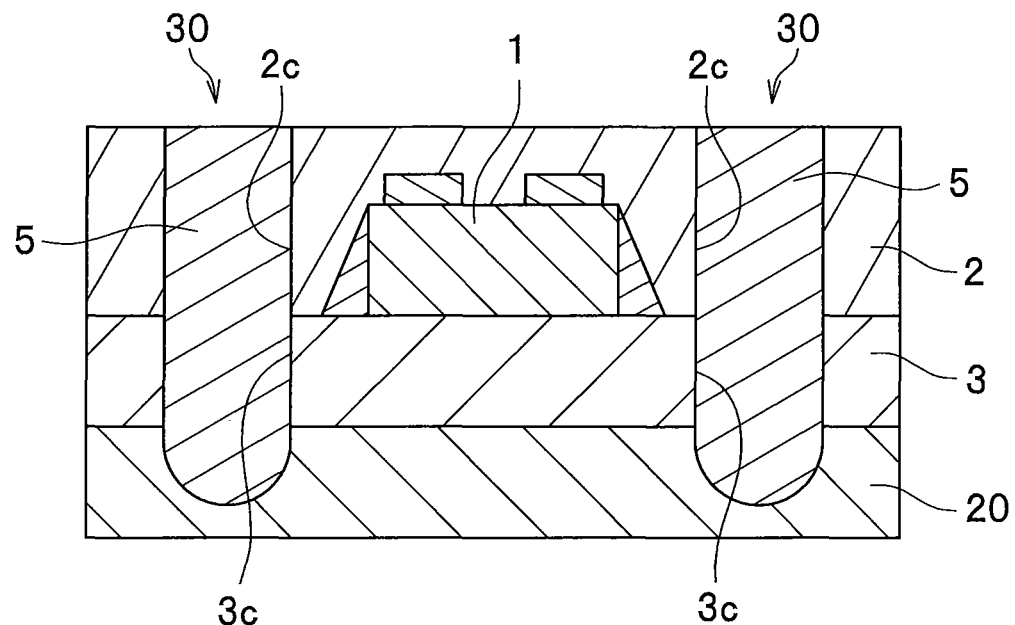
FIG. 6A is a cross-sectional view showing a step of supplying a cover member to cover the outer lateral faces of the wavelength conversion member in the method of manufacturing a light emitting device related to the embodiment.

The step S105 of supplying a cover member, as shown in FIG. 6A, is a step of covering the outer lateral faces 3*c* of the wavelength conversion member 3 with a cover member 5 which contains at least one reflecting substance and at least one coloring substance, and is of the same or a similar body color to the body color of the wavelength conversion member 3.

In the step S105, the cover member 5 is formed through the procedure of covering the outer lateral faces 3*c* of the wavelength conversion member 3 and the outer lateral faces 2*c* of the reflecting member 2 with the cover member 5 by supplying the cover member 5 in the recessed portions 30. The step S105 forms the cover member 5 in the recessed portions 30.

The cover member 5 can be provided, for example, by printing, compression molding, electrodeposition, or the like. Provision of the cover member 5 can alternatively be accomplished by using the resin dispenser described earlier.

In the present embodiment, materials are selected so that the body color of the wavelength conversion member 3 and the body color of the cover member 5 will be the same or similar in colors.

Step of Exposing Electrodes

Figure 6B:
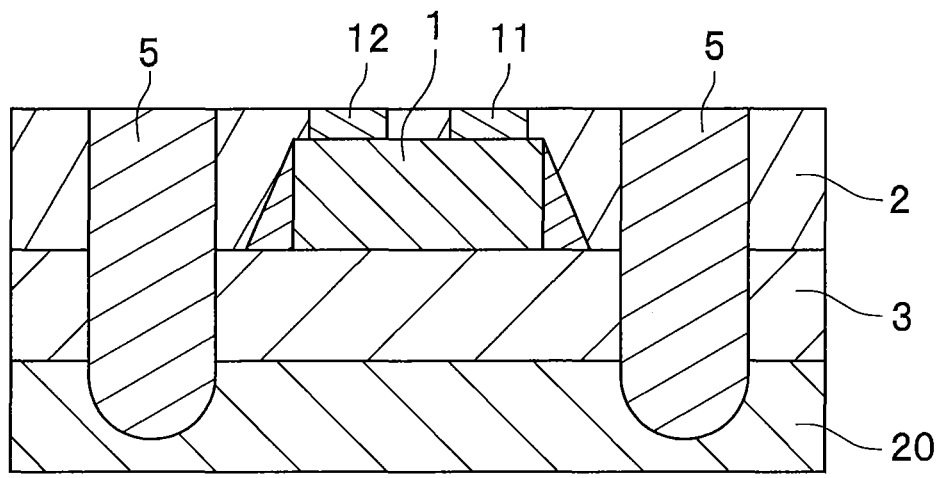
FIG. 6B is a cross-sectional view showing a step of exposing electrodes from the reflecting member in the method of manufacturing a light emitting device related to the embodiment.

The step S106 of exposing electrodes, as shown in FIG. 6B, is a step of removing a portion of the reflecting member 2 and a portion of the cover member 5 on the side where the electrodes 11 and 12 are located so as to expose the electrodes 11 and 12 of the light emitting element 1.

In the step S106, for example, from the side where the electrodes 11 and 12 are disposed, the surfaces of the reflecting member 2 and the cover member 5 are removed until the electrodes 11 and 12 are exposed. Examples of methods of removing the reflecting member 2 and the cover member 5 include grinding, polishing, blasting, and the like.

Step of Transferring onto Different Sheet

Figure 7A:
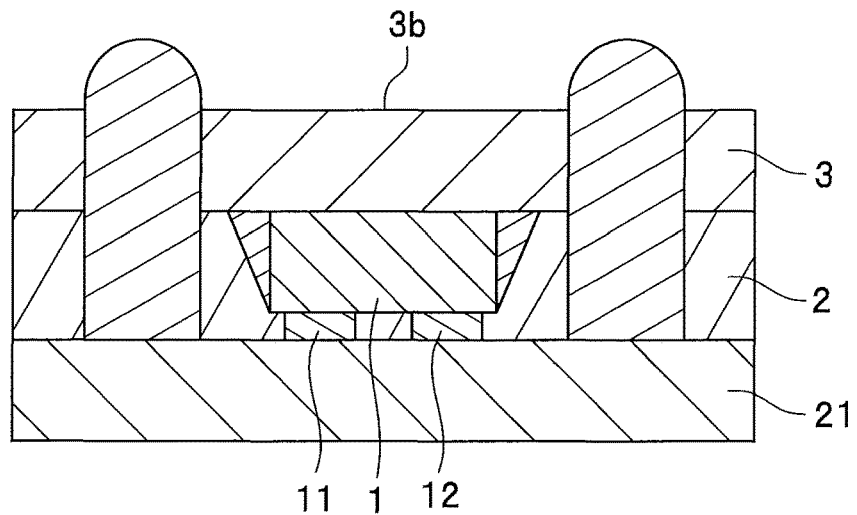
FIG. 7A is a cross-sectional view showing a step of transferring the workpiece onto different sheet in the method of manufacturing a light emitting device related to the embodiment.

The step S107 of transferring onto different sheet, as shown in FIG. 7A, is a step of transferring the structure with the exposed electrodes 11 and 12 onto different sheet 21 formed of a material comprising a resin or the like.

In the step S107, the workpiece is disposed on the sheet 21 so that the electrodes 11 and 12 exposed from the reflecting member 2 are adhered to the sheet 21.

The sheet 20 used in forming the wavelength conversion member 3 is removed before or after transferring the workpiece onto the different sheet 21.

Step of Smoothing Out Upper Face of Light Emitting Device

Figure 7B:
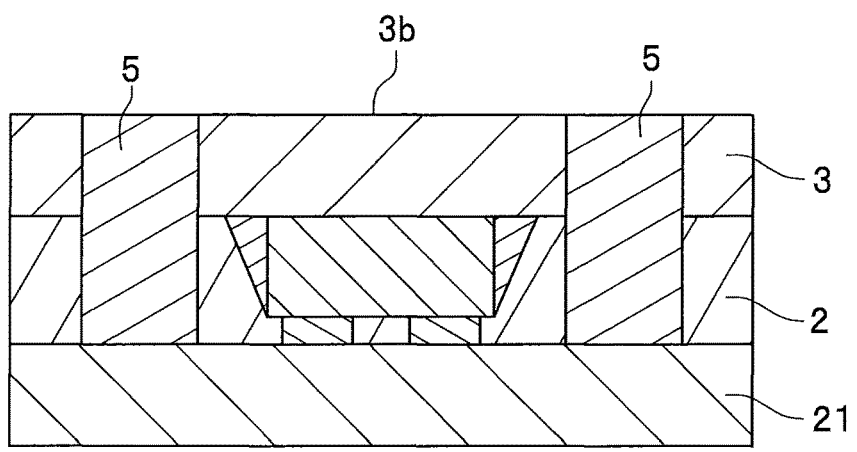
FIG. 7B is a cross-sectional view showing a step of smoothing out the upper face of the light emitting device in the method of manufacturing a light emitting device related to the embodiment.

The step S108 of smoothing out the upper face of the light emitting device, as shown in FIG. 7B, is the step of smoothing out the upper face of the light emitting device by partially removing the cover member 5 exposed on the second face 3*b* side of the wavelength conversion member 3 as a result of removing the sheet 20.

In the step S108, for example, by partially removing the upper face of the light emitting device, the upper face of the light emitting device is made smooth along the second face 3b of the wavelength conversion member 3.

Step of Cutting

Figure 7C:
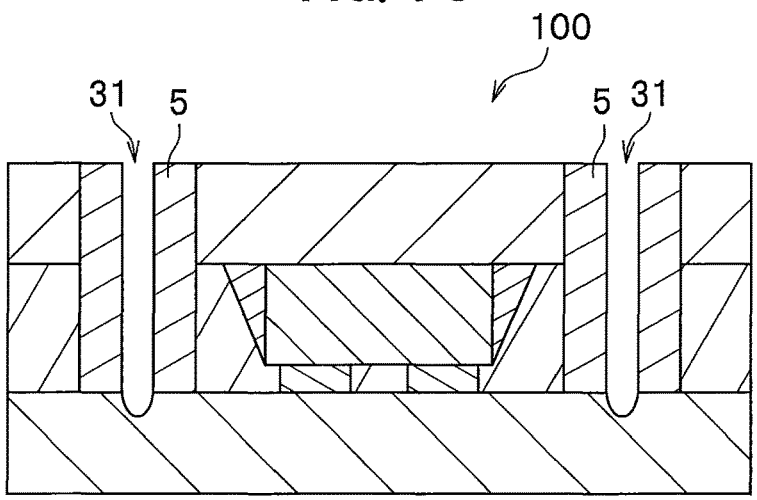
FIG. 7C is a cross-sectional view showing a step of cutting the workpiece into individual devices in the method of manufacturing a light emitting device related to the embodiment.

The cutting the step S109, as shown in FIG. 7C, is a step of cutting along the cutlines that include the cover member 5. That is, the cutting step S109 is a step of dividing a collective body of simultaneously produced multiple light emitting devices 100 into individual devices.

In the step S109, cutlines for dividing the collective body of light emitting devices 100 into individual devices are predefined. The cutlines are predefined so that grooves 31 are positioned in the center of the cover member 5, in other words, the cover member 5 is present on the right and left sides of the grooves 31. That is, the cutlines are predefined so that the cover member 5 is parted right and left of the groove 31 when cutting the collective body into individual devices so as to ultimately be present along the periphery of each light emitting device 100. In FIG. 4A to FIG. 7C, a single light emitting device 100 is shown, but in the actual manufacturing step, multiple devices arranged in rows and columns are produced to be cut into individual devices.

Dividing of the collective body into individual devices is accomplished, for example, by cutting along the center of the grooves 31 in the direction of the width all the way to the sheet 21. The grooves 31 are preferably created so as to reach halfway into the sheet 21.

The collective body can be cut into individual devices by using known methods, such as dicing in which cutting is performed along the grooves 31 using a blade.

As a result of this cutting of the collective body into individual devices, multiple light emitting devices 100 can be obtained.

In the case of multiple light emitting elements 1 are disposed on the sheets 20 and 21, the grooves 31 may be formed between individual light emitting elements or between groups of light emitting elements.

Figure 19A:
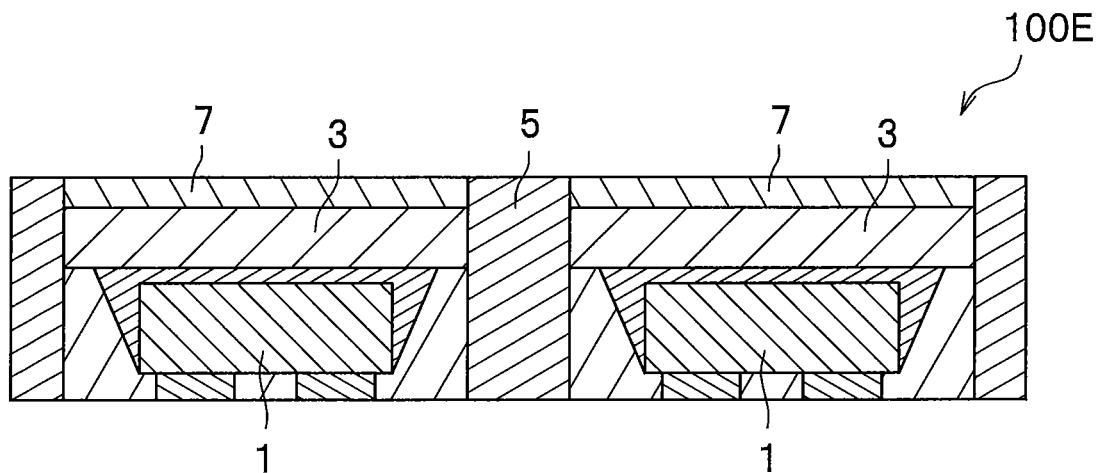
FIG. 19A is a cross-sectional view schematically showing a structure of a light emitting device related to another embodiment.

For example, the light emitting device 100E shown in FIG. 19A can be obtained by forming the recessed portions 30 per light emitting element 1, creating the grooves 31 every two light emitting elements, and cutting every two light emitting elements 1 at the grooves 31.

Figure 19B:
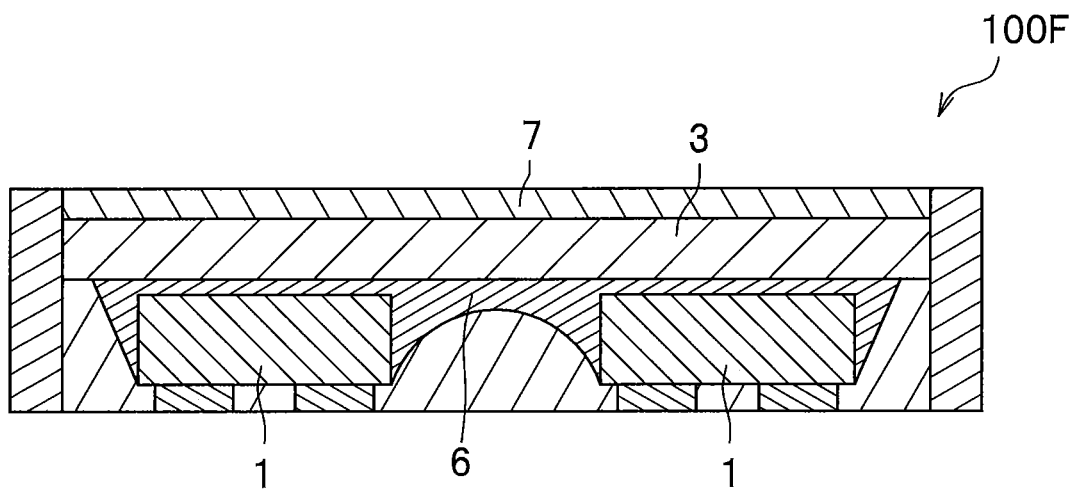
FIG. 19B is a cross-sectional view schematically showing a structure of a light emitting device related to another embodiment.

Moreover, the light emitting device 100F shown in FIG. 19B can be obtained by forming the recessed portions 30 and the grooves 31 every two light emitting elements 1 and cutting at the grooves 31.

The light emitting devices and the methods of manufacturing the same have been specifically described based on the embodiments for carrying out the present disclosure. The present disclosure, however, is not required to those described above, and should be broadly interpreted based on the scope of the claims described herein. Furthermore, various modifications and changes made based on the descriptions are also encompassed within the spirit and scope of the present invention.

Other embodiments will be explained below.

Figure 8A:
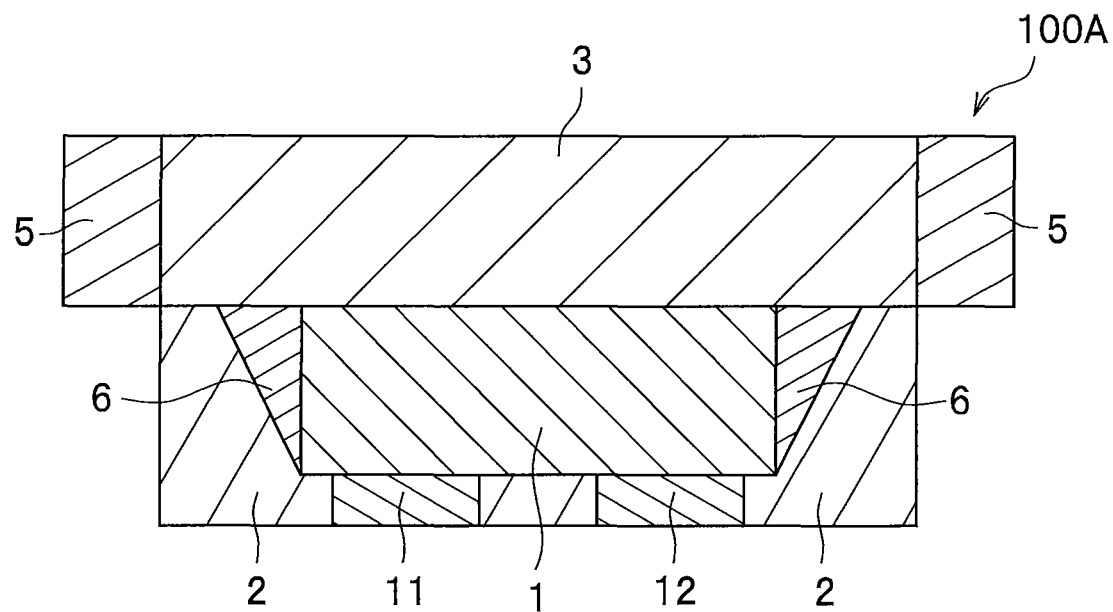
FIG. 8A is a cross-sectional view schematically showing a structure of a light emitting device related to another embodiment.

As in the case of the light emitting device 100A shown in FIG. 8A, the cover member 5 may only cover the wavelength conversion member 3.

This structure can reduce the weight of the light emitting device. The raw material costs for the light emitting device can also be reduced.

The light emitting device 100A can be manufactured by performing etching and using a mask in the step S105 of covering with a cover member.

Moreover, the light emitting device does not have to have a light guide member 6. Furthermore, the light guide member 6 may be disposed not only on the lateral faces of the light emitting element 1, but also between the light emitting element 1 and the wavelength conversion member 3 as in the case of the light emitting device 100B shown FIG. 8B. In this case, from the perspective of more firmly bonding the light emitting element 1 and the wavelength conversion member 3, and from the perspective of increasing luminous flux and light extraction efficiency, the thickness of the light guide member 6 in the up and down direction is preferably 0.5 µm to 20 µm, more preferably 0.5 µm to 10 µm. Moreover, besides providing a single light emitting element 1, multiple light emitting elements 1 may be provided. The light emitting device may be equipped with a mounting substrate for mounting the light emitting device 100.

Figure 8B:
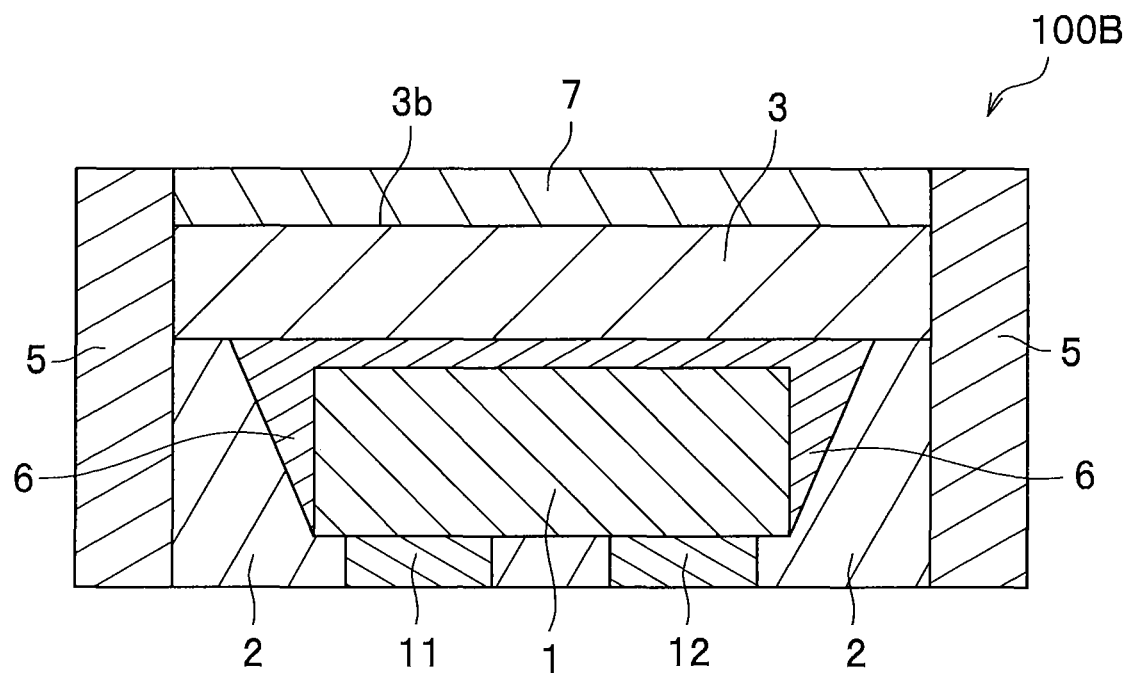
FIG. 8B is a cross-sectional view schematically showing a structure of a light emitting device related to another embodiment.

Furthermore, the wavelength conversion member 3 can have a multilayer structure besides having a single layer structure. The wavelength conversion member 3 may be a stack of multiple wavelength conversion members each having a different wavelength conversion substance so long as it has the same or a similar color to the body color of the cover member 5. The wavelength conversion member 3 may include a light transmissive layer containing substantially no wavelength conversion substance. Moreover, on the wavelength conversion member 3 a light transmissive member, such as a light transmissive layer containing substantially no wavelength conversion substance, a layer containing a diffusing agent, a layer having a concave or convex surface, a convex lens, or the like may be stacked. FIG. 8B shows a device in which a light transmissive layer 7 is stacked on the wavelength conversion member 3. The wavelength conversion substance can be protected against the external environment by stacking a light transmissive layer 7 can protect.

In the case where the wavelength conversion member 3 has a stacked structure and includes a light transmissive layer containing substantially no wavelength conversion substance, the light transmissive member 7 is preferably positioned on the second face 3b of the wavelength conversion member 3 as shown in FIG. 8B. In this case, the light transmissive layer 7 may be formed as a part of the wavelength conversion member 3, but can individually be formed as a layer containing substantially no wavelength conversion substance different from the wavelength conversion member 3 which contains a wavelength conversion substance. Providing the light transmissive layer 7 on the second face 3b of the wavelength conversion member 3 can allow the light transmissive layer 7 to serve as a protective layer protecting the wavelength conversion substance against the external environment once the light emitting device 100B is completed following the removal of the sheet 20.

The light transmissive layer 7 is a light transmissive member, and examples include light transmissive resins, glass, or the like that can be employed as the wavelength conversion member 3.

By disposing a light transmissive layer 7 containing substantially no wavelength conversion substance on the second face 3b of the wavelength conversion member 3 in the step of forming a wavelength conversion member, the upper face of the light emitting device can be easily made smooth in the step S108 of smoothing out the upper face of the light emitting device. More specifically, when smoothing out the upper face of the light emitting device, the light transmissive layer 7 which contains substantially no wavelength conversion substance can be partly removed without partly removing the wavelength conversion member 3. This can attenuate a change in the emission color and a change in the body color of the wavelength conversion member 3.

Figure 9A:
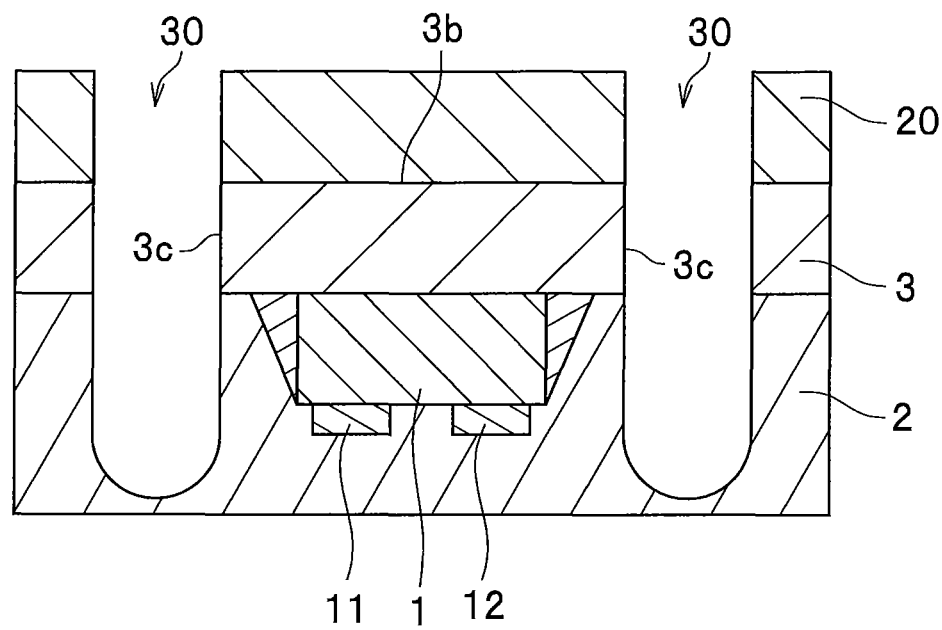
FIG. 9A is a cross-sectional view showing a step of exposing outer lateral faces of the wavelength conversion member in another method of manufacturing a light emitting device related to the embodiment.

In the method of manufacturing a light emitting device described above, the partial removal of the wavelength conversion member 3 is performed from the side close to the first face 3a of the wavelength conversion member 3 in the step S104 of exposing the outer lateral faces of the wavelength conversion member. However, as shown in FIG. 9A, the partial removal of the wavelength conversion member 3 may be performed from the side close to the second face 3b of the wavelength conversion member 3. In this case, the recessed portions 30 can be formed by orienting the workpiece so that the sheet 20 side is up and removing the members from the upper face of the sheet 20 towards the reflecting member 2 in a perpendicular direction or a direction inclined at certain degrees from the perpendicular direction. The formation of the recessed portions 30 can be accomplished by partly removing the reflecting member 2 passing through the sheet 20 and the wavelength conversion member 30. At this time, the reflecting member 2 can be removed to the positions lower than the lower faces of the electrodes 11 and 12 of the light emitting element 1 which face down. The thickness of the reflecting member 2 in the up and down direction can suitably be adjusted beforehand by estimating the removal positions of the reflecting member 2.

Figure 9B:
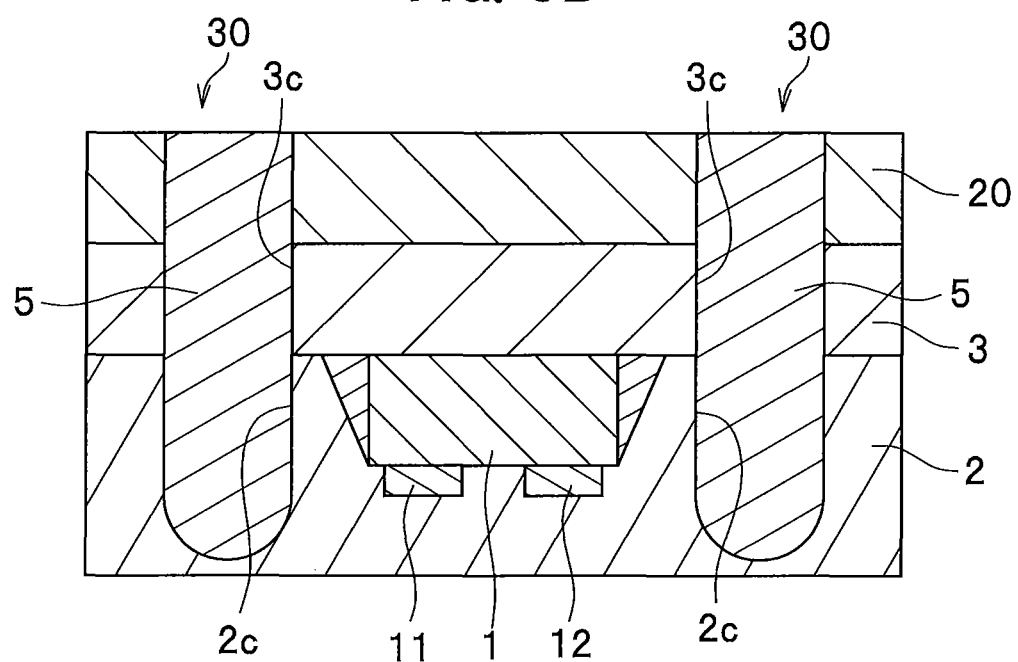
FIG. 9B is a cross-sectional view showing a step of supplying a cover member to cover the outer lateral faces of the wavelength conversion member in the method of manufacturing a light emitting device related to the embodiment.
Figure 10A:
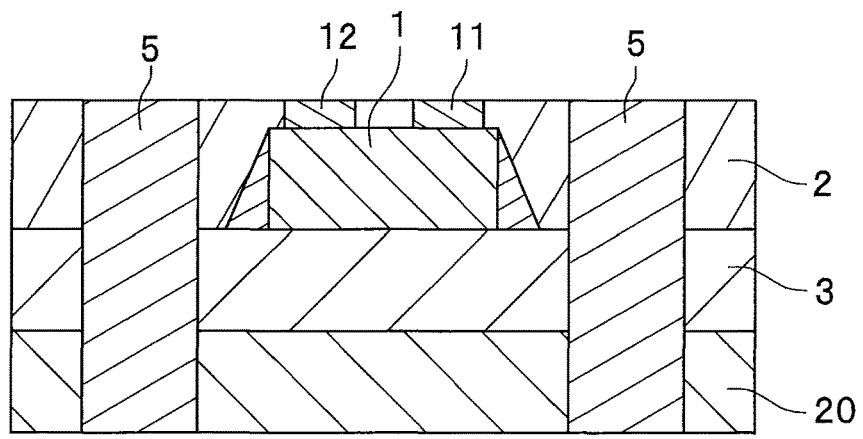
FIG. 10A is a cross-sectional view showing a step of exposing electrodes from the reflecting member in the method of manufacturing a light emitting device related to the embodiment.
Figure 10B:
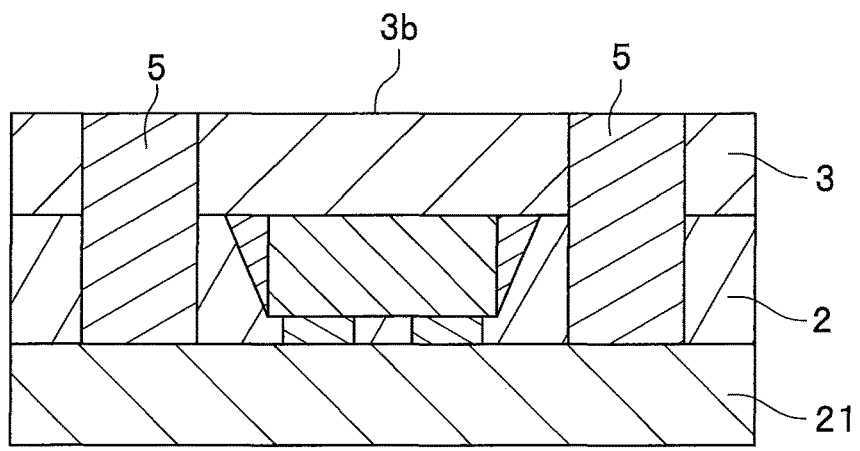
FIG. 10B is a cross-sectional view showing a step of transferring the workpiece onto different sheet in the method of manufacturing a light emitting device related to the embodiment.
Figure 10C:
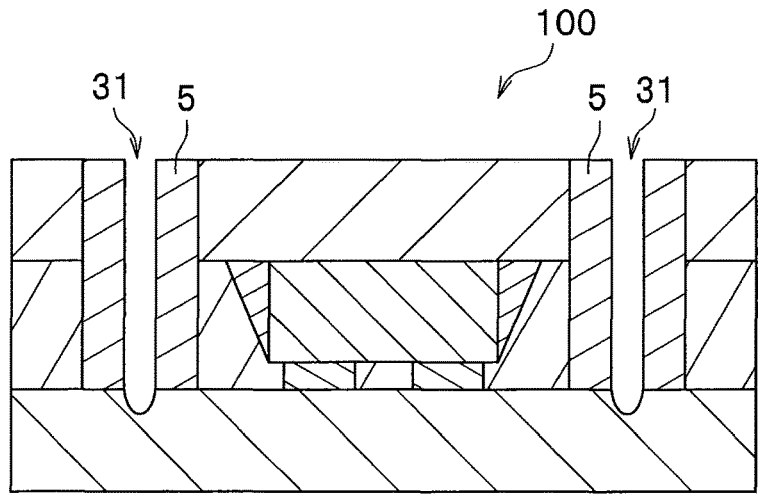
FIG. 10C is a cross-sectional view showing a step of cutting the workpiece into individual devices in the method of manufacturing a light emitting device related to the embodiment.

Subsequently, as shown in FIG. 9B, in the method of manufacturing a light emitting device, a cover member 5, which has the same or a similar body color to the body color of the wavelength conversion member 3, covers the outer lateral faces 3c of the wavelength conversion member 3 and the outer lateral faces 2c of the reflecting member 2. Then, as shown in FIG. 10A, a portion of the reflecting member 2 and a portion of the cover member 5 are removed so as to expose the electrodes 11 and 12 of the light emitting element 1. Subsequently, as shown in FIG. 10B, the workpiece with the exposed electrodes 11 and 12 is transferred onto a different sheet 21 formed of a material comprising a resin. After the transfer, the sheet 20, a portion of the cover member 5, and a portion of the wavelength conversion member 3 are removed. Then, as shown in FIG. 10C, the members including the cover member 5 are cut at the cutlines.

The step S108 of smoothing out the upper face of the light emitting device does not have to be performed, but may be performed for the purpose of further smoothing out the upper face of the light emitting device.

The other particulars are similar to those in the method of manufacturing a light emitting device described earlier.

Figure 11:
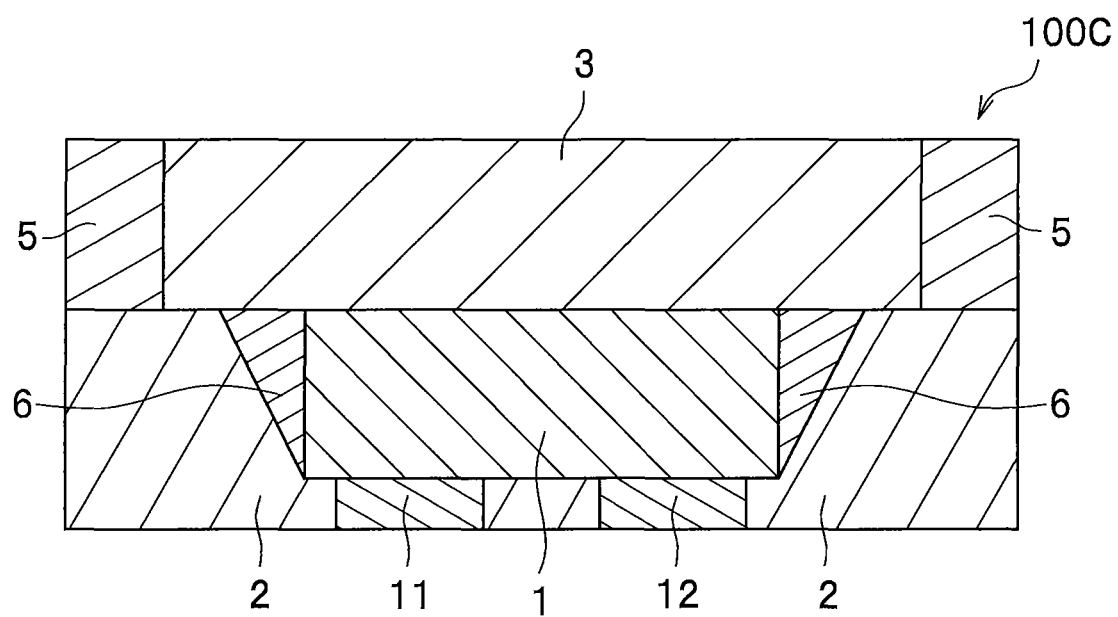
FIG. 11 is a cross-sectional view schematically showing a structure of a light emitting device related to another embodiment.

Furthermore, as in the case of the light emitting device 100C shown in FIG. 11, the light emitting device may have a cover member 5 which covers the lateral faces of the wavelength conversion member 3, and a reflecting member 2 which is disposed under the cover member 5 so as to reach the lower face of the cover member 5.

One example of the method of manufacturing the light emitting device 100C shown in FIG. 11 will be explained below with reference to FIG. 12 to FIG. 14C. In FIG. 13A to FIG. 14C, a single light emitting device 100C among multiple light emitting devices 100C simultaneously manufactured is schematically illustrated.

Figure 12:
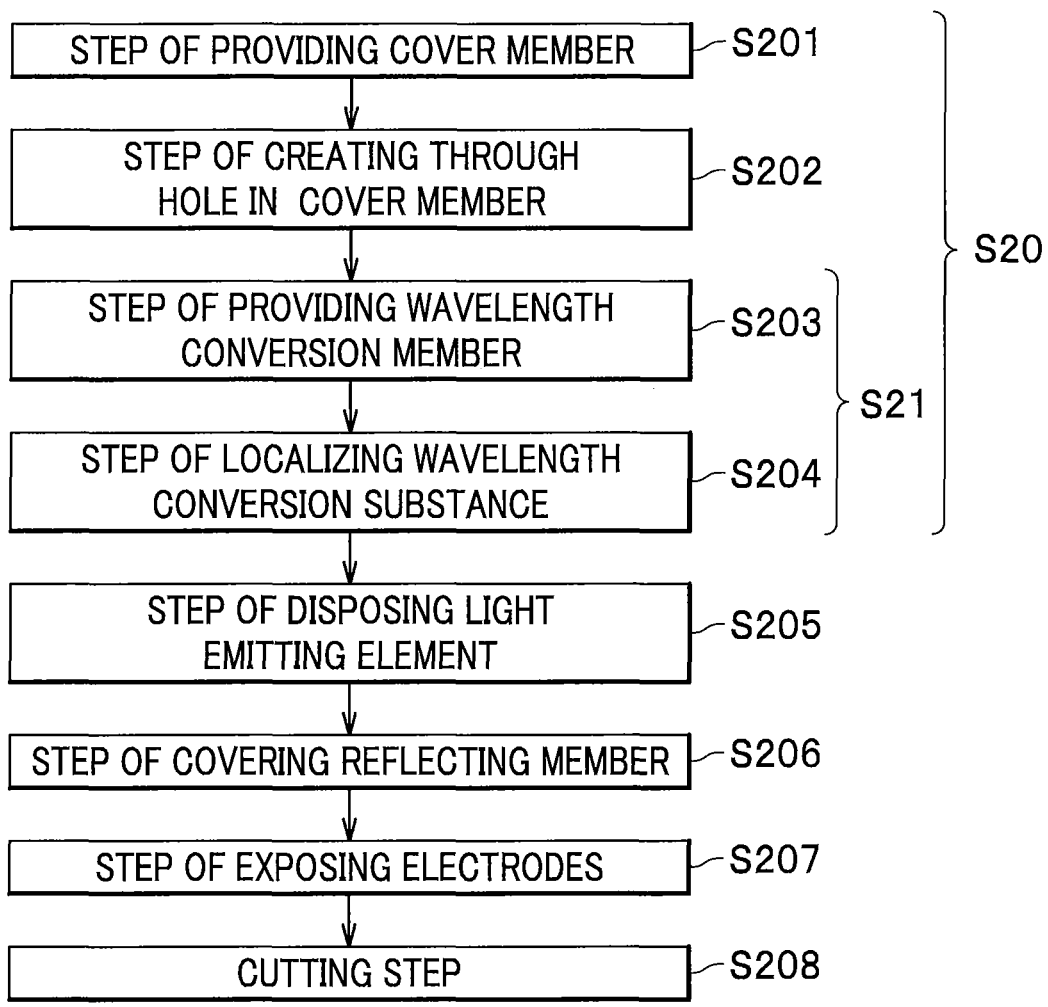
FIG. 12 is a flowchart for the method of manufacturing the light emitting device related to the embodiment shown in FIG. 11.

As shown in FIG. 12, the method of manufacturing a light emitting device 100C includes a step S20 of providing a plate-shaped member, a step S205 of disposing a light emitting element, a step S206 of covering with a reflecting member, a step S207 of exposing electrodes, and a step S208 of cutting, which are performed in that order.

The materials and the layout of the members are as described above with reference to the light emitting devices 100 and 100C, and thus the explanations here will be omitted when appropriate.

Step of Providing Plate-Shaped Member

The step SS20 of providing a plate-shaped member is a step of providing a plate-shaped member 17 which includes a cover member 5, and a wavelength conversion member 3 disposed in the through hole 16 of the cover member 5.

The step 20 of providing a plate-shaped member includes a step S201 of providing a cover member, a step S202 of creating a through hole in the cover member, and a step S21 of supplying a wavelength conversion member, which are performed in that order.

Step of Providing Cover Member

Figure 13A:
FIG. 13A is a cross-sectional view showing a step of providing a cover member in the method of manufacturing the light emitting device related to the embodiment shown in FIG. 11.

The Step S201 of providing a cover member, as shown in FIG. 13A, is a step of providing a plate-shaped cover member 5.

Step of Creating Through Hole in Cover Member

Figure 13B:
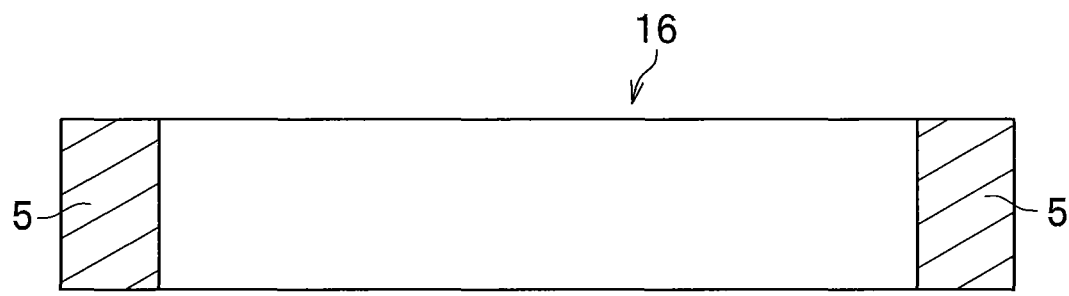
FIG. 13B is a cross-sectional view showing a step of creating a through hole in the cover member in the method of manufacturing the light emitting device related to the embodiment shown in FIG. 11.

The step S202 of creating a through hole in the cover member, as shown in FIG. 13B, is a step of creating a through hole 16 at a predetermined location of the plate-shaped cover member 5.

In the step S202, a through hole 16 is created at the location where the wavelength conversion member 3 of the light emitting device 100C will be formed. The creation of the through hole 16 can be accomplished by punching a hole in a perpendicular direction or a direction inclined at certain degrees from the perpendicular direction from the upper face to the lower face of the cover member 5 using, for example, a die and a punch.

The one side or diameter of the through hole 16 can be suitably selected. The one side or diameter of the through hole 16 can be set, for example, in the range of from 200 μm to 1200 μm. When the one side or diameter of the through hole 16 is larger than the one side or diameter of the light emitting element 1, light extraction efficiency can be increased. When the one side or diameter of the through hole 16 is smaller than the one side or diameter of the light emitting element 1, the emission region can be reduced to thereby increase the luminance.

The shape of the through hole 16 can be, for example, a rectangular, hexagonal, or circular shape, or the like in a top view. Furthermore, the shape of the through hole 16 is preferably mathematically similar to the shape of the light emitting element 1 from the perspective of light distribution.

Step of Supplying Wavelength Conversion Member

Figure 13C:
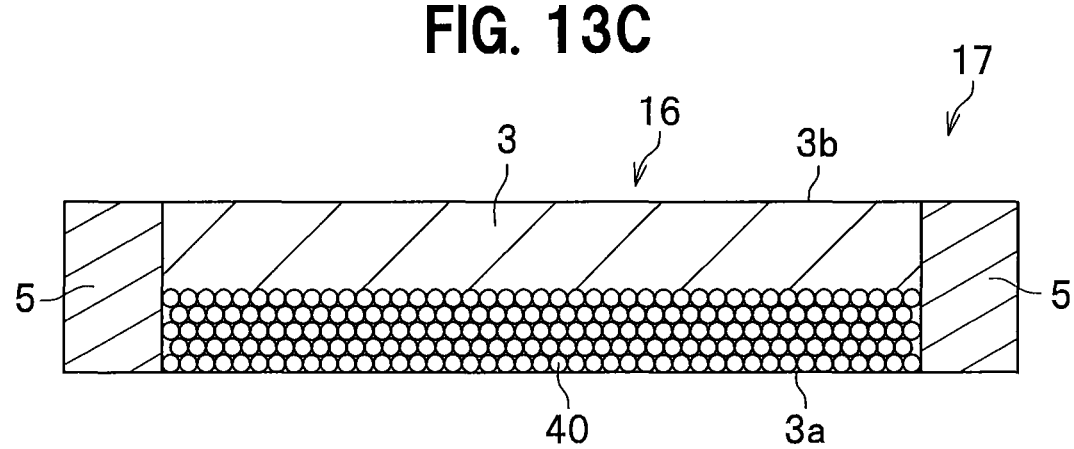
FIG. 13C is a cross-sectional view showing a step of supply a wavelength conversion member in the method of manufacturing the light emitting device related to the embodiment shown in FIG. 11.

The Step 21 of supplying a wavelength conversion member, as shown in FIG. 13C, is a step of supplying a wavelength conversion member 3 in the through hole 16.

The step 21 of supplying a wavelength conversion member includes a step S203 of providing a wavelength conversion member and a step S204 of localizing a wavelength conversion substance, which are performed in that order.

Step of Providing Wavelength Conversion Member

Step S203 of providing a wavelength conversion member is a step of providing a wavelength conversion member 3 which contains at least one wavelength conversion substance and a resin.

In the step S203, the wavelength conversion substance and the resin are combined to form the wavelength conversion member 3.

Step of Localizing Wavelength Conversion Substance

The step S204 of localizing a wavelength conversion substance, as shown in FIG. 13C, is a step of localizing a wavelength conversion substance 40 on or near the first face 3a of the wavelength conversion member 3 or the second face 3b of the wavelength conversion member 3, after supplying the wavelength conversion member 3 in the through hole 16. The first face of 3a of the wavelength conversion member 3 is the face on which the light emitting element 1 is to be disposed. The second face 3b of the wavelength conversion member 3 is the face opposite the face on which the light emitting element 1 is to be disposed. In the present embodiment, the case where the wavelength conversion substance 40 is localized on or near the first face 3a of the wavelength conversion member 3 is illustrated. The wavelength conversion substance 40 will be omitted in the subsequent schematic diagrams.

In step S204, after disposing the wavelength conversion member 3 in the through hole 16, the wavelength conversion substance 40 in the resin is allowed to settle naturally or by force to be localized on the first face 3a side or the second face 3b side of the wavelength conversion member 3. Subsequently, the resin is cured by heating or the like. In this manner, the wavelength conversion member 3 with a localized wavelength conversion substance 40 is obtained. When disposing the wavelength conversion member 3 in the through hole 16, a sheet or the like is disposed on one of the open sides.

The wavelength conversion substance 40 is preferably localized on the first face 3a side of the wavelength conversion member 3. In this manner, the wavelength conversion member 3 would not substantially contain the wavelength conversion substance 40 on the second face 3b side, and the wavelength conversion substance 40 can thus be protected against the external environment.

Step of Disposing Light Emitting Element

Figure 14A:
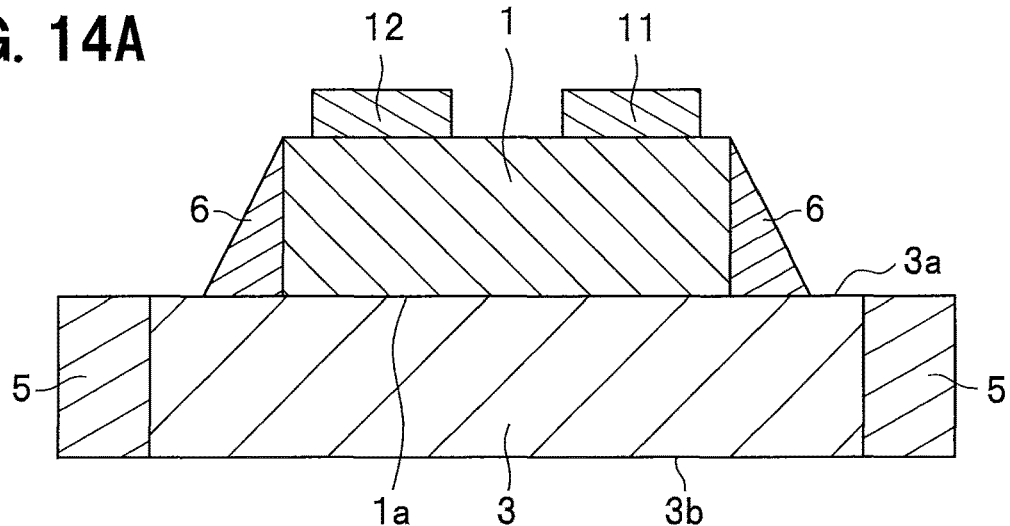
FIG. 14A is a cross-sectional view showing a step of disposing a light emitting element in the method of manufacturing the light emitting device related to the embodiment shown in FIG. 11.

The step S205 of disposing a light emitting element, as shown in FIG. 14A, is a step of disposing a light emitting element 1 so that the emission face 1a faces the first face 3a of the wavelength conversion member 3 which is surrounded by the cover member 5.

The step 205 is similar to the step S102 of disposing a light emitting element explained with reference to the method of manufacturing a light emitting device 100, and thus the explanation will be omitted here.

Step of Supplying Reflecting Member

Figure 14B:
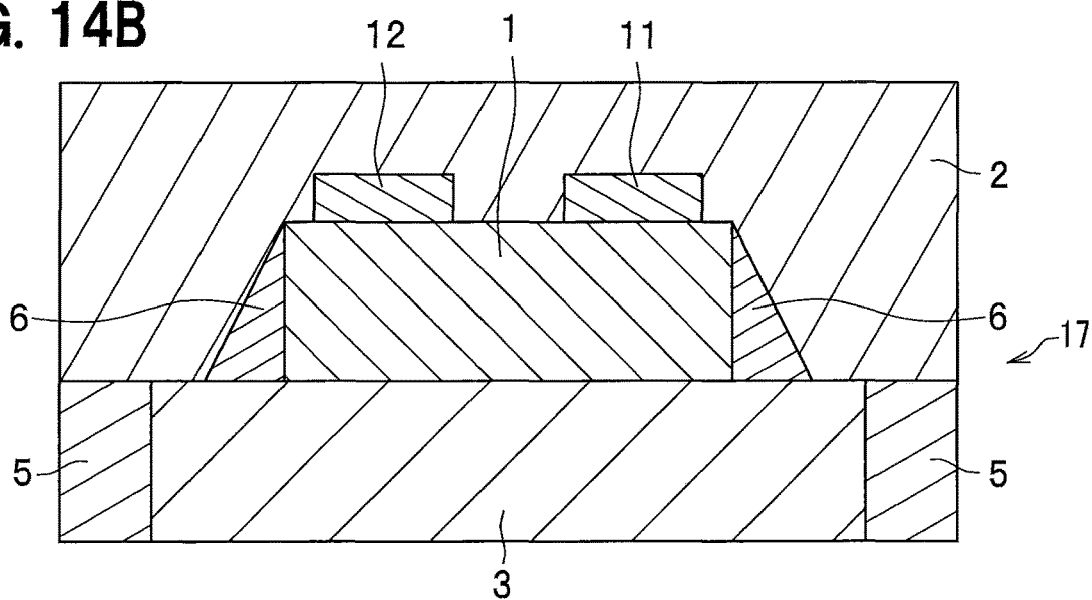
FIG. 14B is a cross-sectional view showing a step of supplying a reflecting member to cover the light emitting element, etc., in the method of manufacturing the light emitting device related to the embodiment shown in FIG. 11.

The step S206 of supplying a reflecting member, as shown in FIG. 14B, is a step of covering the light emitting element 1 disposed on the wavelength conversion member 3 with a reflecting member 2.

In the Step 206, the entire light emitting element 1, including the electrodes 11 and 12, is covered with a reflecting member 2. In the step S206, the reflecting member 2 is disposed from the surfaces of the wavelength conversion member 3 and the cover member 5 at least to the upper faces of the electrodes 11 and 12.

The light emitting element 1 can be covered by using, for example, a dispenser positioned above the fixed plate-shaped member 17 (i.e., the member having the cover member 5 and the wavelength conversion member 3 shown in FIG. 13C) and movable in the up and down direction or lateral direction relative to the plate-shaped member 17. Covering with a reflecting member 2 can be accomplished by supplying a resin to-be the reflecting member 2 above the plate-shaped member 17 with a resin that forms by using a dispenser.

This can alternatively be accomplished by compression molding, transfer molding, or the like.

Step of Exposing Electrodes

Figure 14C:
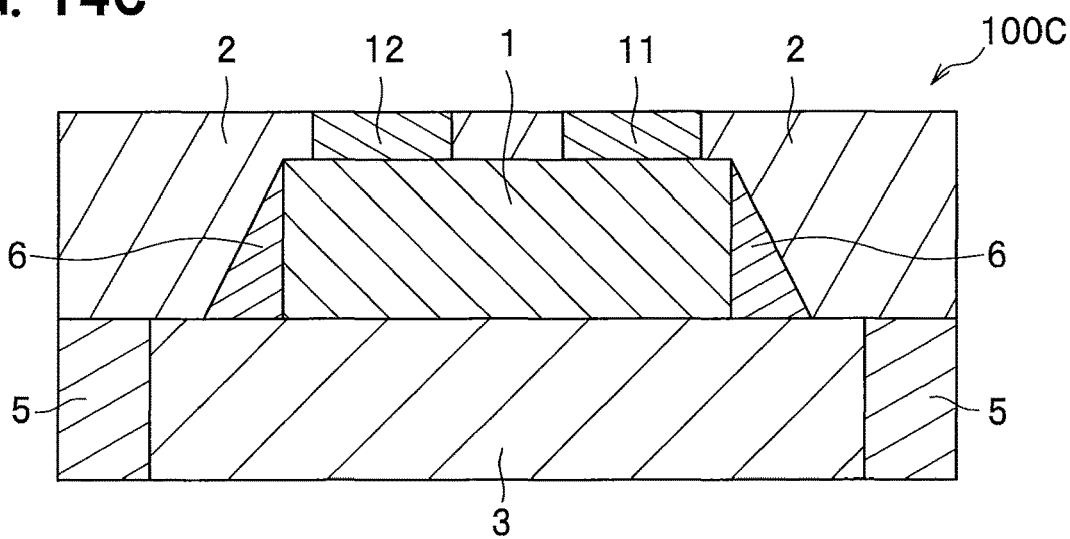
FIG. 14C is a cross-sectional view showing a step of exposing electrodes from the reflecting member in the method of manufacturing the light emitting device related to the embodiment shown in FIG. 11.

The step S207 of exposing electrodes, as shown in FIG. 14C, is a step of removing a portion of the reflecting member 2 on the side, at which the electrodes 11 and 12 of the light emitting element 1 are positioned, so as to expose the electrodes 11 and 12.

In the step S207, for example, the surface of the reflecting member 2 is removed from the electrodes 11 and 12 side until the electrodes 11 and 12 are exposed. Examples of methods for removing the reflecting member 2 include grinding, polishing, blasting, and the like.

Step of Cutting

The cutting step S208 is a step of cutting the collective body of light emitting devices 100C arranged in multiple rows and columns, so as to run through along the cutlines. That is, the cutting step S208 is a step of dividing the collective body of simultaneously manufactured light emitting devices 100C into individual devices.

In the step S208, the cutlines for dividing the collective body of the light emitting devices 100C into individual devices are predefined. The cutlines are defined so that the light emitting devices 100C will be equal size thereto. In FIG. 13A to FIG. 14C, a single light emitting device 100C is shown, but in the actual manufacturing step, multiple devices arranged in rows and columns are formed to be cut into individual pieces.

The collective body can be divided into individual devices by conventionally known methods, such as dicing by which the collective body is cut along cutlines using a blade, breaking by which the collective body is split along cutlines after scribing, or the like.

Multiple light emitting devices 100C are obtained as a result of dividing the collective body into individual pieces.

Figure 15:
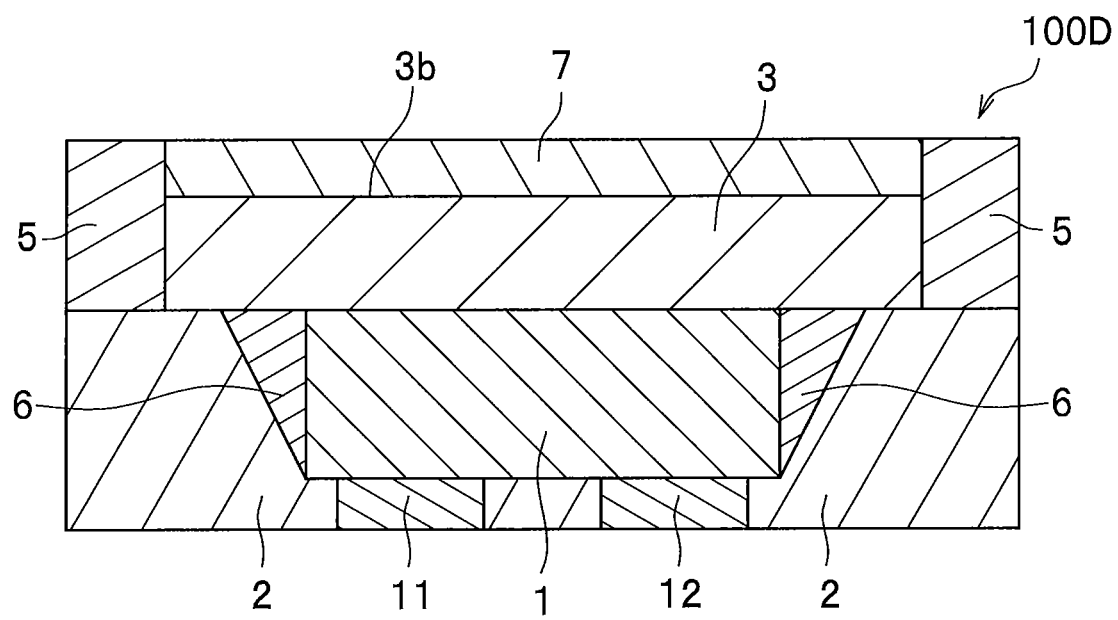
FIG. 15 is a cross-sectional view schematically showing a structure of a light emitting device related to another embodiment.

The light emitting device may be one in which a light transmissive layer 7 is stacked on the wavelength conversion member 3 as in the case of the light emitting device 100D shown in FIG. 15. In the present embodiment, the light transmissive layer 7 is stacked on the second face 3b of the wavelength conversion member 3. The light transmissive member 7 is as described earlier with reference to, for example, the light emitting device 100B, and thus the explanation will be omitted here.

One example of the method of manufacturing the light emitting device 100D shown in FIG. 15 will be explained below with reference to FIG. 16 to FIG. 18C. In FIG. 17A to FIG. 18C, two light emitting devices 100D among multiple light emitting devices 100D simultaneously manufactured are schematically illustrated.

Figure 16:
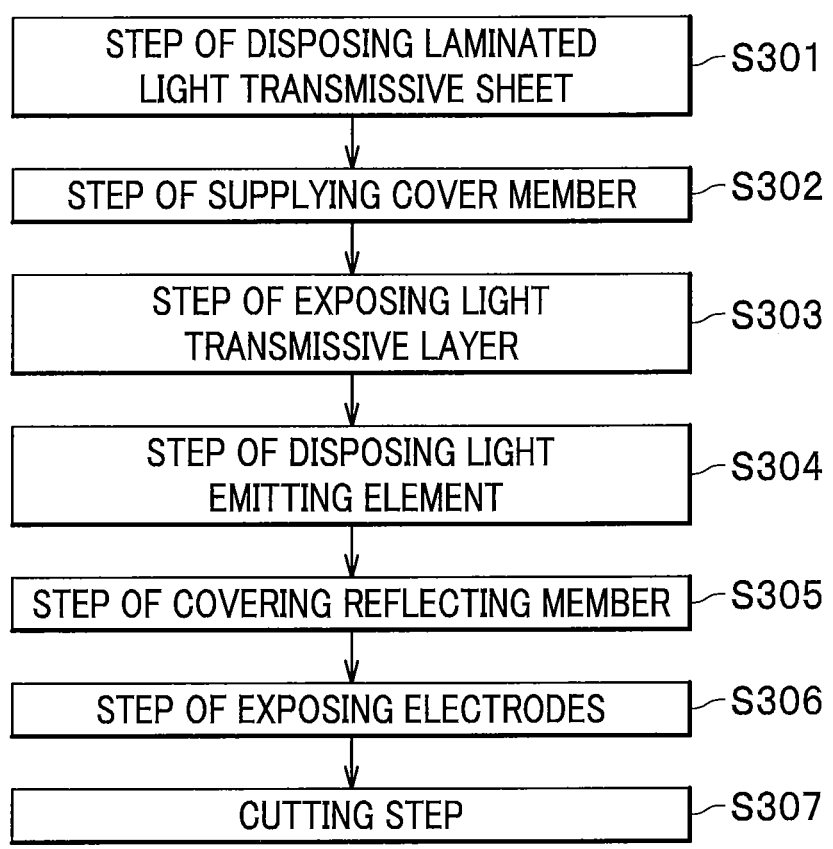
FIG. 16 is a flowchart for the method of manufacturing a light emitting device related to the embodiment shown in FIG. 15.

As shown in FIG. 16, the method of manufacturing the light emitting device 100D includes a step S301 of disposing a laminated light transmissive sheet, a step S302 of supplying a cover member, a step S303 of exposing the light transmissive layer, a step S304 of disposing a light emitting element, a step S305 of supplying a reflecting member, a step S306 of exposing electrodes, and a step S307 of cutting, which are performed in that order.

The materials and the layout of the members are as described above with reference to the light emitting devices 100, 100C, and 100D, and thus the explanations will be omitted here when appropriate.

Step of Disposing Laminated Light Transmissive Sheet

Figure 17A:
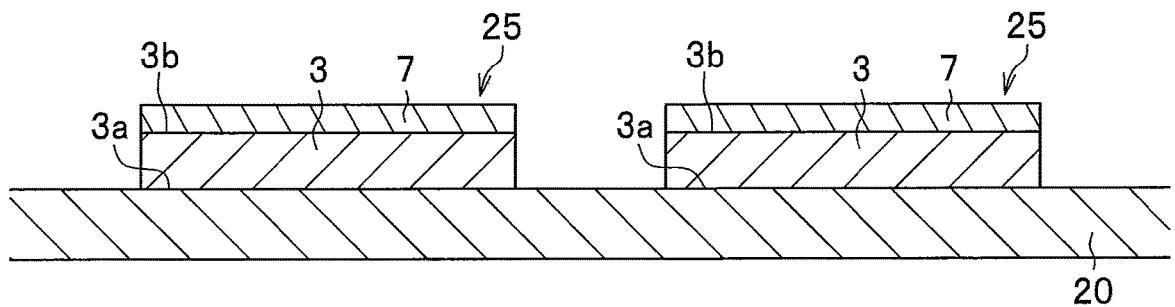
FIG. 17A is a cross-sectional view showing a step of disposing a laminated light transmissive sheet in the method of manufacturing the light emitting device related to the embodiment shown in FIG. 15.

The step S301 of disposing the laminated light transmissive sheet, as shown in FIG. 17A, is a step of disposing multiple laminated light transmissive sheets (i.e., blocks thereof) 25 which each have a stack of a wavelength conversion member 3 and a light transmissive layer 7, on a sheet 20 formed of a resin or the like at certain intervals.

Prior to the step S301, for example, a sheet in which a light transmissive layer 7 is stacked on the second face 3b of the wavelength conversion member 3 is provided. Moreover, as described earlier, the wavelength conversion substance 40 may be localized on or near the first face 3a of the wavelength conversion member 3.

Step of Supplying Cover Member

Figure 17B:
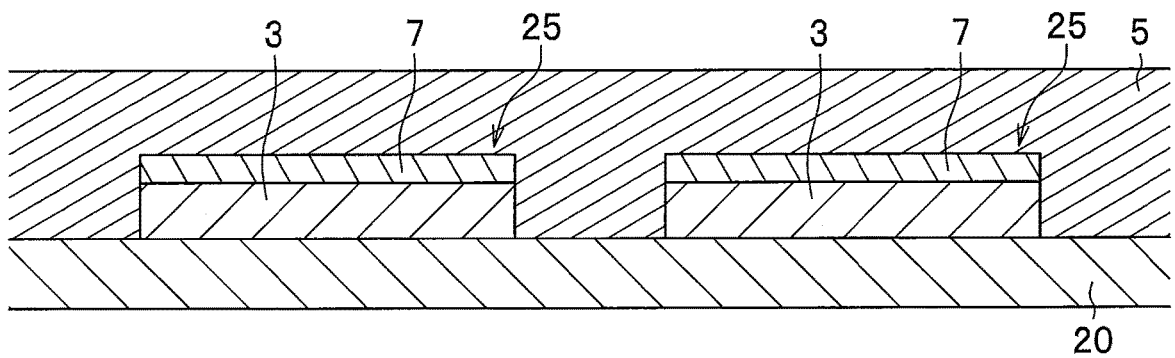
FIG. 17B is a cross-sectional view showing a step of supplying a cover member in the method of manufacturing the light emitting device related to the embodiment shown in FIG. 15.

The step S302 of supplying a cover member, as shown in FIG. 17B, is a step of covering the laminated light transmissive sheet 25 disposed on the sheet 20 with a cover member 5.

In the step S302, the laminated light transmissive sheet 25 in its entirety is covered with a cover member 5. In the step S302, the cover member 5 is disposed from the surface of the sheet 20 to the upper face of the light transmissive layer 7.

Covering of the laminated light transmissive sheet 25 can be accomplished by using a dispenser movable above the fixed sheet 20 in the up and down direction or lateral direction relative to the sheet 20. Covering of the laminated light transmissive sheet 25 can be accomplished by supplying resin or the like to-be the cover member 5 on using a dispenser.

Alternatively, this can be accomplished by compression molding, transfer molding, or the like.

Step of Exposing Light Transmissive Layer

Figure 17C:
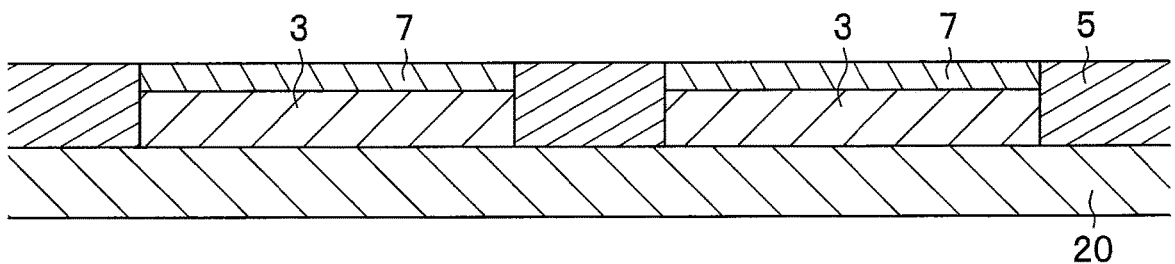
FIG. 17C is a cross-sectional view showing a step of exposing the light transmissive layer in the method of manufacturing the light emitting device related to the embodiment shown in FIG. 15.

The step S303 of exposing the light transmissive layer, as shown in FIG. 17C, is a step of removing a portion of the cover member 5 on the light transmissive layer 7 side so as to expose the light transmissive layer 7.

In the step S303, for example, the surface of the cover member 5 is removed from the light transmissive layer 7 side until the light transmissive layer 7 is exposed. Examples of methods for removing the cover member 5 include grinding, polishing, blasting, and the like. In the step S303, a portion of the light transmissive layer 7 may be removed.

Subsequent to exposing the light transmissive layer 7, the sheet 20 is removed. However, the sheet 20 may be removed before exposing the light transmissive layer 7.

Step of Disposing Light Emitting Element

Figure 17D:
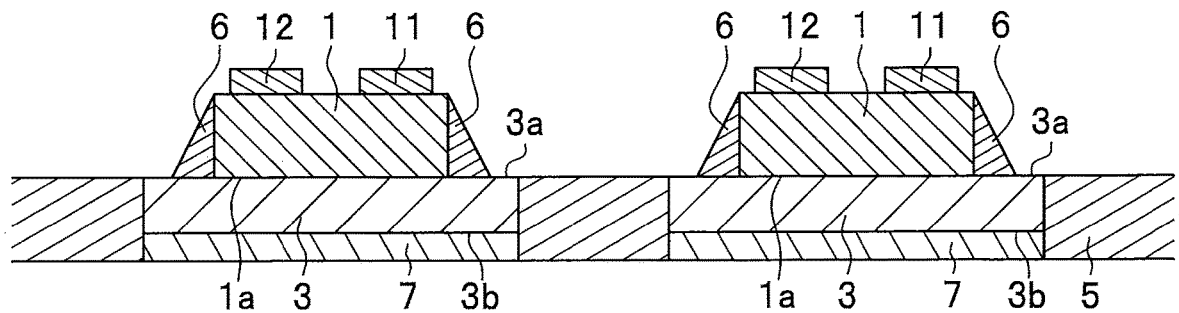
FIG. 17D is a cross-sectional view showing a step of disposing a light emitting element in the method of manufacturing the light emitting device related to the embodiment shown in FIG. 15.

The step S304 of disposing a light emitting element, as shown in FIG. 17D, is a step of disposing light emitting elements 1 so that the emission faces 1a face the first faces 3a of the wavelength conversion members 3.

The step S304 is similar to the step S205 of disposing a light emitting element explained with reference to the method of manufacturing light emitting devices 100C, and thus the explanation will be omitted here.

Step of Supplying Reflecting Member

Figure 18A:
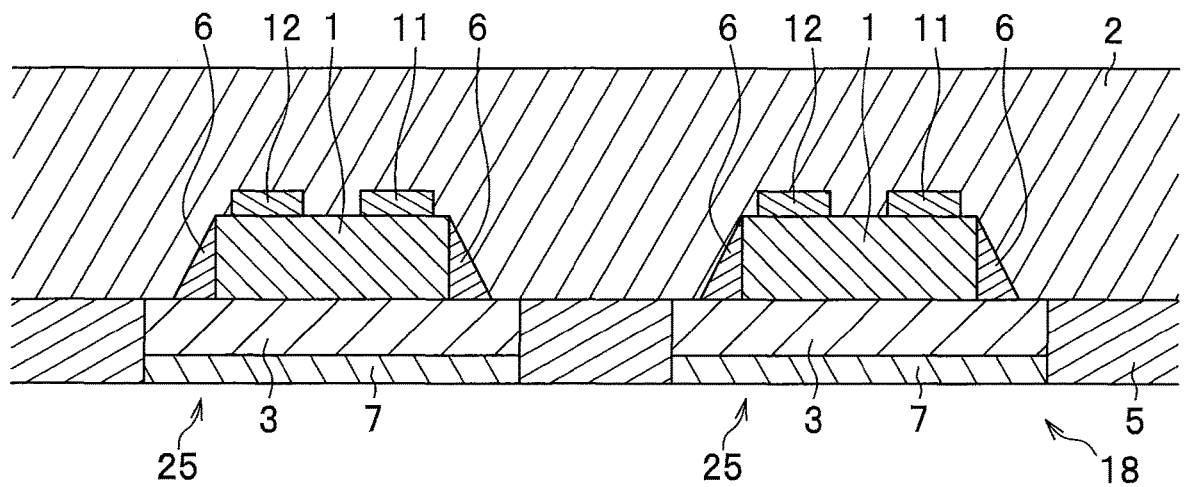
FIG. 18A is a cross-sectional view showing a step of supplying a reflecting member in the method of manufacturing the light emitting device related to the embodiment shown in FIG. 15.

The step S305 of supplying a reflecting member, as shown in FIG. 18A, is a step of covering the light emitting elements 1 disposed on the wavelength conversion members 3 with a reflecting member 2.

The step S305 is similar to the step S206 of supplying a reflecting member explained with reference to the method of manufacturing light emitting devices 100C except for disposing the reflecting member 2 on the plate-shaped member 18 (having a cover member 5 and a laminated light transmissive sheet 25), instead of the plate-shaped member 17 (having the cover member 5 and the wavelength conversion member 3 shown in FIG. 13C). Thus, the explanation will be omitted here.

Step of Exposing Electrodes

Figure 18B:
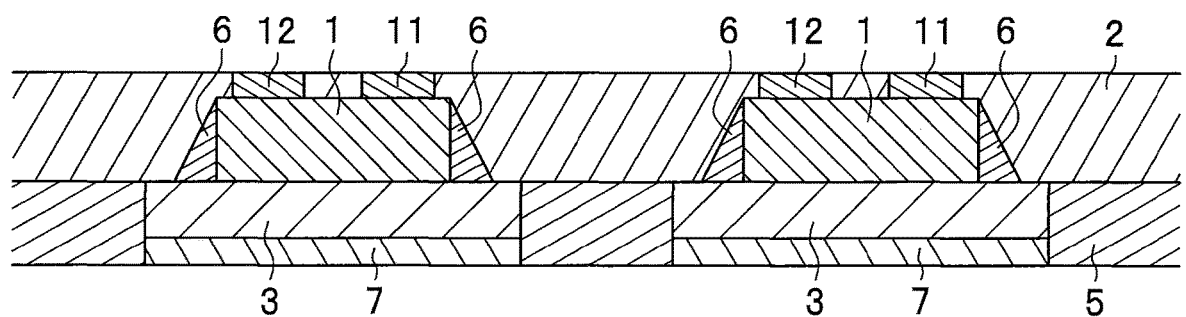
FIG. 18B is a cross-sectional view showing a step of exposing electrodes in the method of manufacturing the light emitting device related to the embodiment shown in FIG. 15.

The step S306 of exposing electrodes, as shown in FIG. 18B, is a step of removing a portion of the reflecting member 2 on the electrodes 11 and 12 side of the light emitting elements 1 so as to expose the electrodes 11 and 12.

The step S306 is similar to the step S207 of exposing electrodes explained with reference to the method of manufacturing light emitting elements 100C, and thus the explanation will be omitted here.

Step of Cutting

Figure 18C:
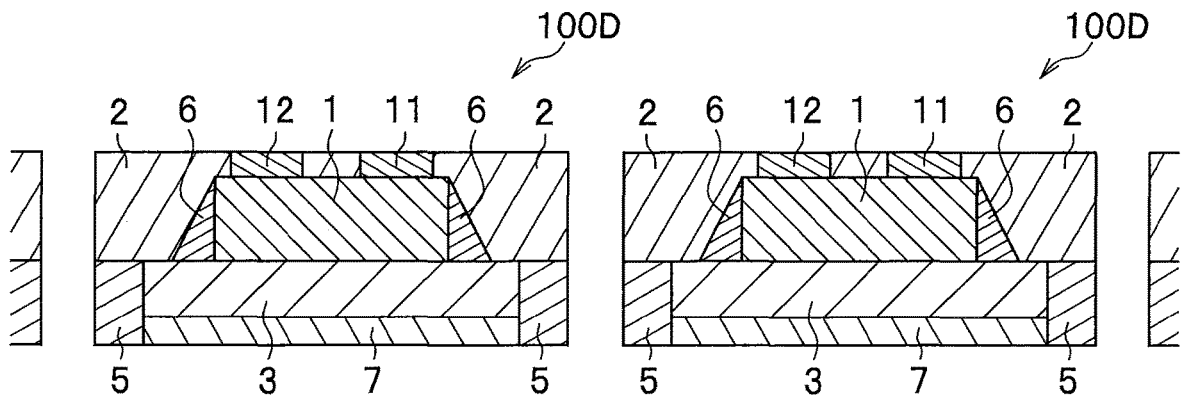
FIG. 18C is a cross-sectional view showing a cutting step in the method of manufacturing the light emitting device related to the embodiment shown in FIG. 15.

The step S307 of cutting, as shown in FIG. 18C, is a step of cutting the collective body of light emitting devices 100D arranged in multiple rows and columns, so as to run through along cutlines. That is, the step S307 of cutting is a step of dividing the collective body of multiple light emitting devices 100D simultaneously produced into individual devices.

The step S307 is similar to the step S208 of cutting explained with reference to the method of manufacturing light emitting devices 100C, and thus the explanation will be omitted here. In FIG. 17A to FIG. 18C, only two light emitting devices 100D are shown, but in the actual manufacturing step, they are formed in multiple rows and columns to be divided into individual pieces.

Multiple light emitting devices 100D are obtained as a result of dividing the collective body into individual devices.

The methods of manufacturing light emitting devices may include other steps before, after, or between the steps described above, to the extent that any such additional step does not adversely affect the steps described above. For example, a step of removing foreign matter to remove foreign matter which might get mixed in during manufacturing, or the like can be included.

The light emitting devices related to the embodiments of the present disclosure can be utilized in various types of lighting devices, such as camera flashlights, lighting fixtures, and the like.

What is claimed is:

1. A light emitting device comprising:
   a light emitting element having an upper emission face, a lower face and one or more lateral faces;
   a reflecting member that reflects light emitted from the light emitting element to a wavelength conversion member, and has an upper face, a lower face and one or more inner and outer lateral faces, wherein the inner lateral face or faces is disposed on the lateral face side of the light emitting element;
   a wavelength conversion member that contains a wavelength conversion substance and has an upper emission face, a lower face and one or more lateral faces, wherein the lower face is disposed on the upper emission face of the light emitting element and on the upper face of the reflecting member; and
   a cover member having one or more inner and outer lateral faces, wherein the inner lateral face or faces completely covers the lateral face or faces of the wavelength conversion member; wherein
   the cover member contains a reflecting substance and a coloring substance, and
   the wavelength conversion member body color and the cover member body color are the same as or different from each other and are in a predetermined hue range of three consecutive hue sections on the Munsell hue circle in the Munsell color system (20 hues),
   the wavelength conversion member body color and the cover member body color are the same as or different from each other and are in a predetermined lightness range of three consecutive lightness sections in the Munsell color system (20 hues),
   the wavelength conversion member body color and the cover member body color are the same as or different from each other and are in a predetermined chroma range of three consecutive chroma sections in the Munsell color system (20 hues), and
   the cover member inner lateral face or faces cover only the wavelength conversion member.

2. The light emitting device according to claim 1, wherein a content of the reflecting substance relative to the cover member is in a range of from 30 percentage by mass to 70 percentage by mass.

3. The light emitting device according to claim 1, wherein the reflecting member is disposed on at least a part of the lateral face or faces of the light emitting element via a light guide member.

4. The light emitting device according to claim 1, wherein the coloring substance comprises at least one material selected from the group consisting of a wavelength conversion substance, a pigment, and a dye.

5. The light emitting device according to claim 4, wherein the wavelength conversion member contains a wavelength conversion substance having the same composition as the wavelength conversion substance contained in the cover member.

6. The light emitting device according to claim 1, wherein the coloring substance of the cover member comprises at least one of a wavelength conversion substance, pigment or dye.

7. The light emitting device according to claim 6, wherein the cover member directly contacts the wavelength conversion member.

8. The light emitting device according to claim 7, wherein the wavelength conversion substance is a phosphor.

9. The light emitting device according to claim 6, wherein the wavelength conversion substance is a phosphor.

10. The light emitting device according to claim 1, wherein the cover member directly contacts the wavelength conversion member.

11. The light emitting device according to claim 1, wherein the wavelength conversion substance is a phosphor.

12. The light emitting device according to claim 1, wherein the cover member covers only the wavelength conversion member.

* * * * *